(12) United States Patent
Lee et al.

(10) Patent No.: US 10,818,738 B2
(45) Date of Patent: Oct. 27, 2020

(54) ORGANIC LIGHT-EMITTING DISPLAY DEVICE HAVING TOUCHSCREEN AND METHOD OF MANUFACTURING THE SAME

(71) Applicant: LG Display Co., Ltd., Seoul (KR)

(72) Inventors: Young-Wook Lee, Goyang-si (KR); Bok-Young Lee, Seoul (KR); Jin-Kwon Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/732,034

(22) Filed: Dec. 31, 2019

(65) Prior Publication Data

US 2020/0135813 A1    Apr. 30, 2020

Related U.S. Application Data

(63) Continuation of application No. 16/002,072, filed on Jun. 7, 2018, now Pat. No. 10,566,395.

(30) Foreign Application Priority Data

Jun. 7, 2017    (KR) .................. 10-2017-0070901

(51) Int. Cl.
 *H01L 27/32* (2006.01)
 *H01L 51/00* (2006.01)
 (Continued)

(52) U.S. Cl.
 CPC ............ *H01L 27/323* (2013.01); *G06F 3/044* (2013.01); *G06F 3/0412* (2013.01);
 (Continued)

(58) Field of Classification Search
 CPC .............. H01L 27/323; H01L 51/5253; H01L 27/3276; H01L 51/0097; H01L 2227/323;
 (Continued)

(56) References Cited

U.S. PATENT DOCUMENTS 10,566,395 B2 * 2/2020 Lee ..................... H01L 51/5253
2010/0110041 A1   5/2010 Jang
(Continued)

FOREIGN PATENT DOCUMENTS

| EP | 2 687 963 A2 | 1/2014 |
| EP | 2 991 116 A1 | 3/2016 |
| JP | 2018-128835 A | 8/2018 |

OTHER PUBLICATIONS

European Search Report dated Sep. 24, 2018 issued in the corresponding European Patent Application No. 18176492.9, pp. 1-7.

(Continued)

*Primary Examiner* — Kyoung Lee
(74) *Attorney, Agent, or Firm* — Polsinelli PC

(57) ABSTRACT

Disclosed is an organic light-emitting display device having a touchscreen in which the configuration of a pad unit and a circuit board connected to the pad unit is simplified, resulting in bonding stability and an improved form factor of the device, and a method of manufacturing the same. In the organic light-emitting display device having the touchscreen in which a touch electrode is directly provided on an encapsulation layer, a touch pad and a display pad are disposed parallel to each other on the same side so as to be connected to a flexible printed circuit board with a difference in height therebetween. Thereby, increased bonding reliability and an increased effective display area are achieved.

20 Claims, 15 Drawing Sheets

(51) Int. Cl.
　　　*G06F 3/041*　　　(2006.01)
　　　*G06F 3/044*　　　(2006.01)
　　　*H01L 51/52*　　　(2006.01)

(52) U.S. Cl.
　　　CPC .......... *G06F 3/0443* (2019.05); *G06F 3/0446* (2019.05); *G06F 3/04164* (2019.05); *H01L 27/3276* (2013.01); *H01L 51/0097* (2013.01); *H01L 51/5253* (2013.01); *G06F 2203/04102* (2013.01); *G06F 2203/04103* (2013.01); *G06F 2203/04111* (2013.01); *H01L 2227/323* (2013.01); *H01L 2251/5338* (2013.01); *H01L 2251/5392* (2013.01)

(58) Field of Classification Search
　　　CPC ..... H01L 2251/5392; H01L 2251/5338; G06F 3/044; G06F 3/0412; G06F 2203/04103; G06F 2203/04102; G06F 2203/04111
　　　See application file for complete search history.

(56)　　　　　　　References Cited

U.S. PATENT DOCUMENTS

| | | |
|---|---|---|
| 2012/0105339 A1 | 5/2012 | Jung |
| 2016/0128194 A1 | 5/2016 | Hong et al. |
| 2016/0188059 A1 | 6/2016 | Lee et al. |

OTHER PUBLICATIONS

Office Action dated Jun. 6, 2019 issued in the corresponding Japanese Patent Application No. 2018-108217 (2 pages); English translation (3 pages).

* cited by examiner

ORGANIC LIGHT-EMITTING DISPLAY DEVICE HAVING TOUCHSCREEN AND METHOD OF MANUFACTURING THE SAME

CROSS REFERENCE TO RELATED APPLICATIONS

This application is a continuation of U.S. patent application Ser. No. 16/002,072, filed on Jun. 7, 2018, which claims the benefit of Korean Patent Application No. 10-2017-0070901, filed on Jun. 7, 2017, all of which are hereby incorporated by reference in their entirety as if fully set forth herein.

BACKGROUND

Field of the Disclosure

The present disclosure relates to a display device, and more particularly, to an organic light-emitting display device and a method of manufacturing the same to have a touchscreen in which the configuration of a pad unit and a circuit board connected to the pad unit is simplified, resulting in bonding stability and an improved form factor of the device.

Description of the Background

A touchscreen is an input device that is disposed on a display device and allows a user to input a command by selecting a content appearing on a screen of a display device or the like with the human hand or an object. That is, the touchscreen converts a contact position that the human hand or the object directly touches into an electrical signal, and receives the content selected at the contact position as an input signal. The touchscreen may eliminate a separate input device, which is connected to the display device and operates, such as a keyboard or a mouse, and thus the use range thereof is gradually expanding.

Such a touchscreen is generally attached to the front surface of a display panel, such as a liquid crystal display panel or an organic light-emitting diode display panel, via an adhesive. In this case, since the touchscreen is separately manufactured and attached to the front surface of the display panel, the manufacturing process becomes complicated due to the addition of such an attachment process. Moreover, upon attachment of such different types of panels, misalignment or the like may deteriorate yield, which causes increase in processing burden and costs.

SUMMARY

Accordingly, the present disclosure is directed to an organic light-emitting display device having a touchscreen and a method of manufacturing the same that substantially obviate one or more problems due to limitations and disadvantages of the related art.

The present disclosure has been provided to solve the problems described above, and an object of the present disclosure is to provide an organic light-emitting display device having a touchscreen in which the configuration of a pad unit and a circuit board connected to the pad unit is simplified, resulting in bonding stability and an improved form factor of the device, and a method of manufacturing the same.

Additional advantages and features of the disclosure will be set forth in part in the description which follows and in part will become apparent to those having ordinary skill in the art upon examination of the following or may be learned from practice of the disclosure. The other advantages of the disclosure may be realized and attained by the structure particularly pointed out in the written description and claims hereof as well as the appended drawings.

To achieve these and other advantages and in accordance with the purpose of the disclosure, as embodied and broadly described herein, in an organic light-emitting display device having a touchscreen, a display pad and a touch pad for a touchscreen are provided on the same side of a substrate through a common formation process, whereby easy arrangement as well as connection stability due to the prevention of a difference in height between the pads and a circuit board may be achieved.

In accordance with one aspect of the present disclosure, an organic light-emitting display device includes a substrate including an active area and a non-active area, a plurality of thin-film transistors disposed in the active area, a plurality of light-emitting elements connected to the respective thin-film transistors in the active area, an encapsulation layer configured to cover the thin-film transistors and the light-emitting elements, a touch electrode array including a plurality of first touch electrodes and second touch electrodes arranged on the encapsulation layer to intersect each other in the active area, a plurality of display pads and a plurality of touch pads arranged in the non-active area on a same side of the substrate so as to be parallel to and spaced apart from each other, and a flexible printed circuit board connected both to the display pads and to the touch pads.

The organic light-emitting display device further includes a plurality of touch link wires provided in the non-active area above the encapsulation layer on the substrate and configured to connect the touch pads to the first touch electrodes and the second touch electrodes, respectively, and a plurality of display link wires provided in the non-active area below the encapsulation layer on the substrate and configured to connect the display pads to the thin-film transistors, respectively.

The touch link wires and the display link wires ma include an overlapping portion by interposing the encapsulation layer therebetween.

Each first touch electrode may include a first touch pattern and a first bridge, each second touch electrode may include a second touch pattern and a second bridge, the first touch pattern and the second touch pattern may be in the same layer, the first bridge may be integrated with the first touch pattern, and the second bridge may be located in a layer different from the first touch pattern and the second touch pattern interposing a touch insulation layer therebetween at an intersection of the first touch electrode and the second touch electrode, and may be connected to the second touch pattern through a touch connection hole formed in the touch insulation layer.

Each touch pad may include touch pad electrodes in multiple layers, and each touch link wire may be located in the same layer as the second bridge, and may be integrated with the touch pad electrode forming at least one layer of the touch pad.

Each touch pad may include touch pad electrodes in multiple layers, each touch link wire may be located in the same layer as the first bridge, and at least one touch pad electrode constituting the touch pad may be lengthened so as to be connected to the touch link wire.

Each touch pad may include touch pad electrodes in multiple layers, the organic light-emitting display device may further include one or more insulation layers between the touch link wires and at least one touch pad electrode of the touch pad, and each touch link wire may be electrically connected to the at least one touch pad electrode through a connection hole formed in the one or more insulation layers.

The one or more insulation layers between the touch link wires and the at least one touch pad electrode of the touch pad may be inorganic layers.

Each display pad may include a first display pad electrode in the same layer as the thin-film transistors and a second display pad electrode in a layer different from the first display pad electrode, and each touch pad may include a first touch pad electrode in the same layer as the first display pad electrode and a second touch pad electrode in the same layer as the second display pad electrode.

The second display pad electrode and the second touch pad electrode may be located in the same layer as the first touch pattern and the second touch pattern.

The one or more insulation layers including the connection hole may be located between the first touch pad electrode and the touch link wire, and the connection hole may be located above the first touch pad electrode and below the touch link wire.

The organic light-emitting display device may further include a connection pad electrode located in the same layer as one layer of the light-emitting elements between a first touch pad electrode and a second touch pad electrode of each touch pad.

Each light-emitting element may include an anode electrode connected to a corresponding one of the thin-film transistors, a cathode electrode disposed to face the anode electrode, and at least one light-emitting stack disposed between the anode electrode and the cathode electrode and configured to generate white light, and the organic light-emitting display device may further include a color filter disposed above one of the cathode electrode, the encapsulation layer, and the first and second touch electrodes.

In accordance with another aspect of the present disclosure, a method of manufacturing an organic light-emitting display device includes forming a plurality of thin-film transistors disposed in an active area of a substrate, and forming a plurality of first display pad electrodes and a plurality of first touch pad electrodes parallel to the first display pad electrodes on a same side of the substrate in a non-active area located outside the active area, forming light-emitting elements connected to the respective thin-film transistors in the active area of the substrate, forming an encapsulation layer to cover the thin-film transistors and the light-emitting elements, forming a touch electrode array including a first touch electrode and a second touch electrode intersecting each other in the active area above the encapsulation layer, and forming second display pad electrodes and second touch pad electrodes connected respectively to the first display pad electrodes and the first touch pad electrodes in the non-active area, and connecting the second display pad electrodes and the second touch pad electrodes to a flexible printed circuit board.

The step of forming the first display pad electrodes and the first touch pad electrodes, may comprise forming a plurality of display link wires to connect the first display pad electrodes with the respective thin-film transistors.

The step of forming the touch electrode array, the second display pad electrodes, and the second touch pad electrodes, may comprise forming a plurality of touch link wires to connect the first and second touch electrodes with the respective second touch pad electrodes.

The forming the first and second touch electrodes may include forming a plurality of first bridges in the active area on the encapsulation layer, forming a touch insulation layer including touch connection holes corresponding to opposite sides of each first bridge, and forming, on the touch insulation layer, a plurality of first touch patterns, which are connected at opposite sides thereof to neighboring first bridges through the touch connection holes, a plurality of second touch patterns, which are spaced apart from the first touch patterns and the touch connection holes, and a plurality of second bridges, which are located in the same layer as the second touch patterns and are connected to the second touch patterns.

The touch link wire may be formed in the same layer as the first bridges.

The step of forming the touch link wire, may comprise forming the touch link wire may so as to overlap each first touch pad electrode.

The method of manufacturing the organic light-emitting display device may further comprise electrically connecting the touch link wire to each second touch pad electrode by irradiating a laser from a bottom side of the substrate to an overlapping portion of the touch link wire and the first touch pad electrode.

The step of forming the touch insulation layer, may comprise forming connection holes to expose each first touch pad electrode and each first display pad electrode, respectively.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
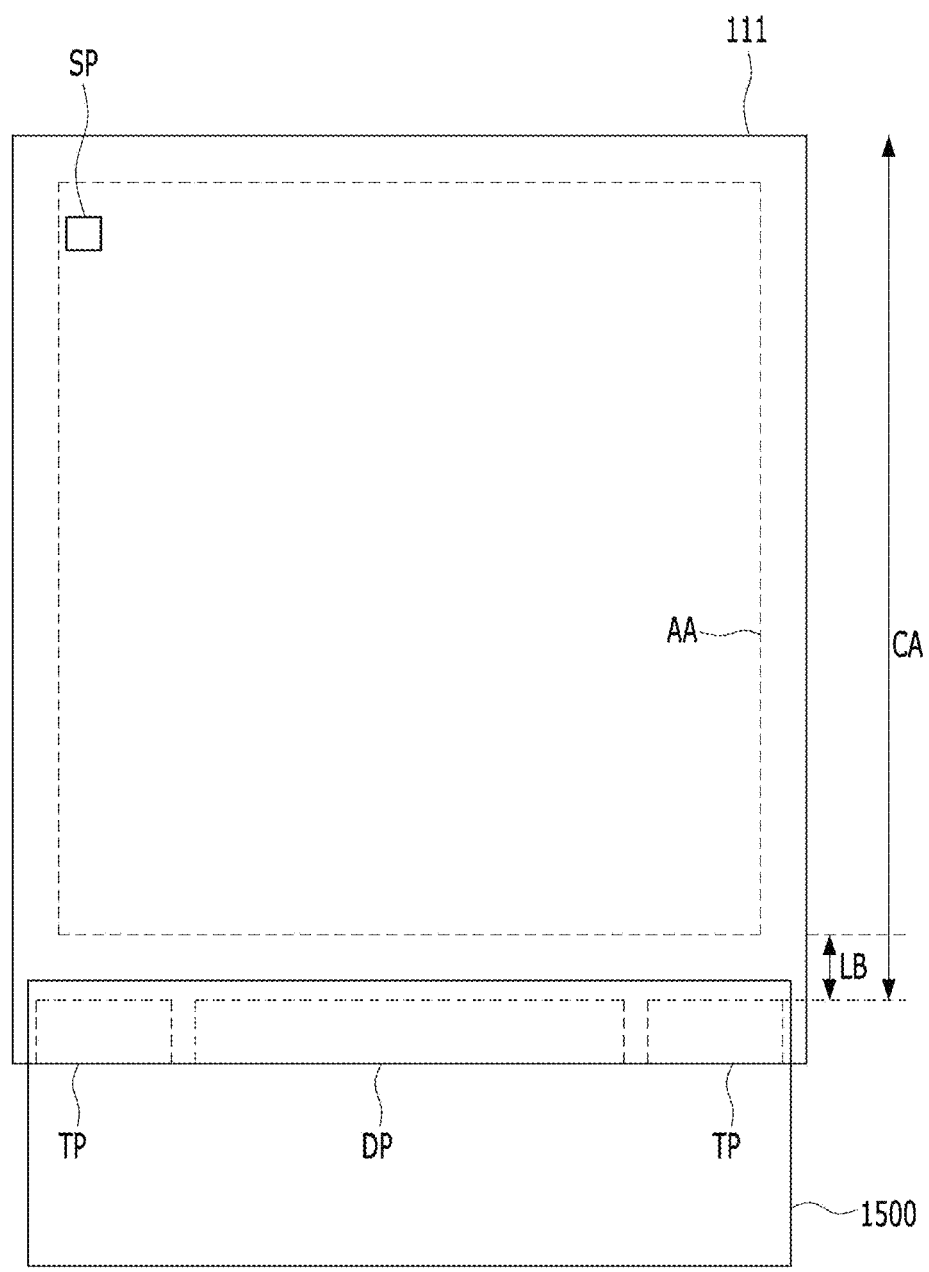
FIG. 1 is a plan view illustrating an organic light-emitting display device having a touchscreen according to the present disclosure.

The advantages and features of the present disclosure and the way of attaining them will become apparent with reference to aspects described below in detail in conjunction with the accompanying drawings. The present disclosure, however, is not limited to the aspects disclosed hereinafter and may be embodied in many different forms. Rather, these exemplary aspects are provided so that this disclosure will be through and complete and will fully convey the scope to those skilled in the art. Thus, the scope of the present disclosure should be defined by the claims.

The shapes, sizes, ratios, angles, numbers, and the like, which are illustrated in the drawings in order to describe various aspects of the present disclosure, are merely given by way of example, and therefore, the present disclosure is not limited to the illustrations in the drawings. The same or extremely similar elements are designated by the same reference numerals throughout the specification. In addition, in the description of the present disclosure, a detailed description of related known technologies will be omitted when it may make the subject matter of the present disclosure rather unclear. In the present specification, when the terms "comprises", "includes", and the like are used, other elements may be added unless the term "only" is used. An element described in the singular form is intended to include a plurality of elements unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the description of the various aspects of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various aspects of the present disclosure may be partially or wholly coupled to and combined with each other, and various technical linkages and driving thereof are possible. These various aspects may be performed independently of each other, or may be performed in association with each other.

Hereinafter, aspects related to an organic light-emitting display device having a touchscreen and a method of manufacturing the same according to the present disclosure will be described in detail with reference to the accompanying drawings.

Figure 2:
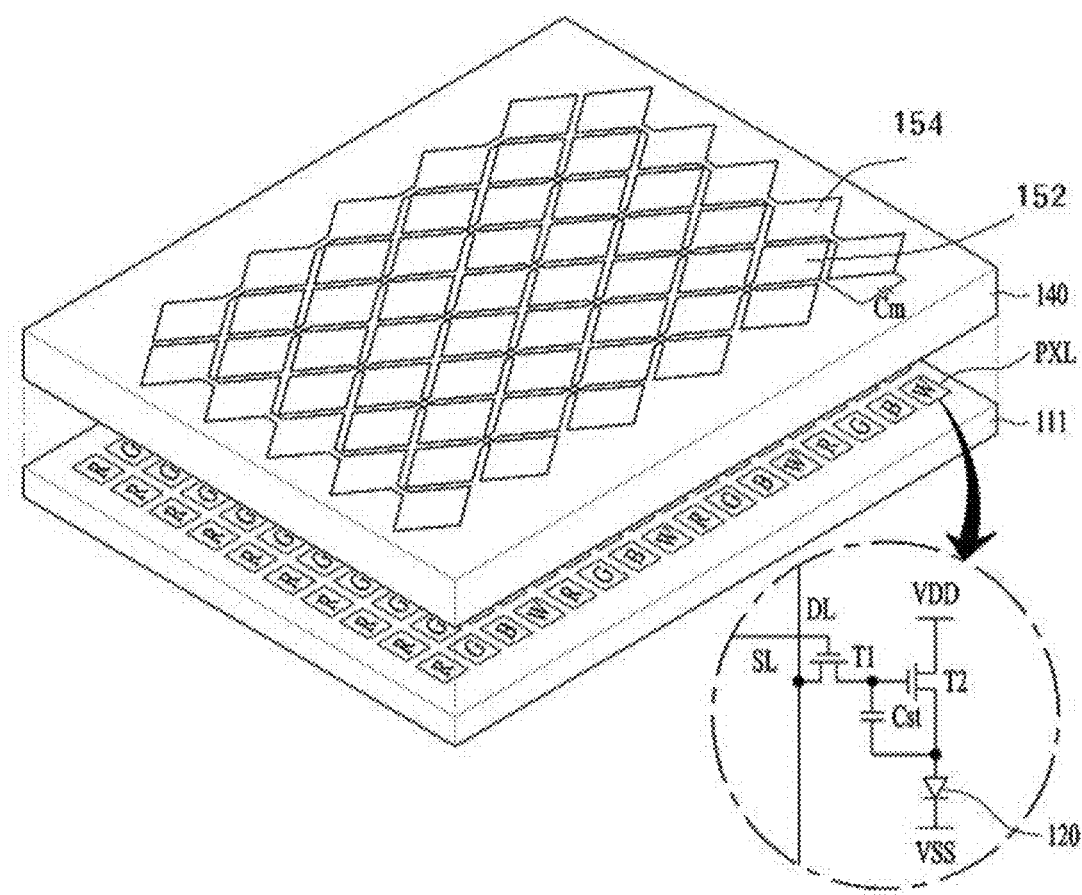
FIG. 2 is a perspective view illustrating an active area of FIG. 1.
Figure 3:
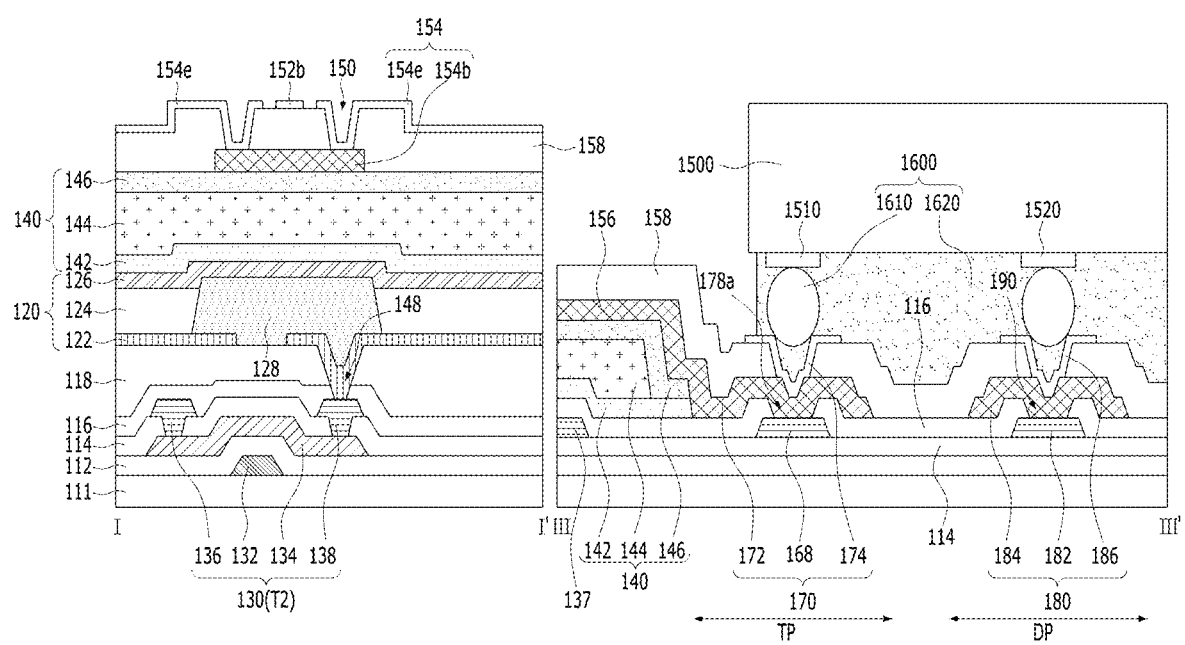
FIG. 3 is a cross-sectional view separately illustrating a portion of the active area and a pad unit in the organic light-emitting display device having the touchscreen according to a first aspect of the present disclosure.

FIG. 1 is a plan view illustrating an organic light-emitting display device having a touchscreen according to the present disclosure, and FIG. 2 is a perspective view illustrating an active area of FIG. 1. In addition, FIG. 3 is a cross-sectional view separately illustrating a portion of the active area and a pad unit in the organic light-emitting display device having the touchscreen according to a first aspect of the present disclosure.

As illustrated in FIG. 1, the organic light-emitting display device having the touchscreen according to the present disclosure includes a touch pad TP and a display pad DP provided on the same side of a substrate 111, and a single flexible printed circuit board 1500 is connected to both the touch pad TP and the display pad DP.

The substrate 111 is largely divided into a central active area AA (the area inside a dotted line) and a non-active area outside thereof. The substrate 111 is illustrated as having a rectangular shape, and the outer rim thereof is defined by four sides. A portion of the non-active area (outside the active area AA), which corresponds to one of the four sides of the substrate 111, has a width larger than the remaining portion of the non-active area. A pad unit, which includes the touch pad TP and the display pad DP, is provided in the larger-width portion of the non-active area, and the single flexible printed circuit board 1500 is connected to the pad unit. In the organic light-emitting display device having the touchscreen according to the present disclosure, in order to connect the single flexible printed circuit board 1500 to both the touch pad TP and the display pad DP, the touch pad TP and the display pad DP are aligned on a single side.

Here, the shape of the substrate 111 is not limited to a rectangular shape, and may be modified to a polygonal shape or a circular shape. The illustration is based on the form of a generally manufactured display device. In the organic light-emitting display device having the touchscreen according to the present disclosure, the flexible printed circuit board 1500 is located on the same side as the pad unit, regardless of the shape of the substrate 111.

The substrate 111 may be one of a transparent glass substrate, a transparent plastic substrate, an opaque plastic substrate, and a reflective metal substrate. In addition, the substrate 111 may be flexible by adjusting thickness or using a flexible material.

Each of the touch pad TP and the display pad DP is provided in a plural number so as to correspond in number to, for example, the number of touch electrodes 152 and 154 and the number of scan lines and data lines, which are provided on the substrate 111. Since the touch pad TP and the display pad DP are located on the same side of the substrate 111, and moreover, when the touch pad TP and the display pad DP have a multilayer structure, at least one layer of the touch pad TP and at least one layer of the display pad DP are located on the same plane, the touch pad TP and the display pad DP are parallel to and spaced apart from each other so as not to overlap each other.

Referring to FIG. 2, in the active area of the substrate 111, subpixels SP are arranged in a matrix form, and scan lines SL and data lines DL for defining the respective subpixels SP are provided to intersect each other. A pixel-driving circuit and a light-emitting element 120, which is connected to a thin-film transistor of the pixel-driving circuit, are provided at each intersection of the scan lines SL and the data lines DL.

Based on a layered configuration, the organic light-emitting display device having the touchscreen according to the present disclosure, as illustrated in FIGS. 2 and 3, includes an encapsulation layer 140 configured to cover the pixel-driving circuit, which includes the scan line SL and the data line DL, and the light-emitting element 120 in the active area, and further includes first and second touch electrodes 152 and 154 arranged to intersect each other on the encapsulation layer 140.

The organic light-emitting display device senses the presence or absence of a touch and a touch position by sensing a variation in mutual capacitance Cm in response to a user touch made by a finger or an object such as a stylus via the first and second touch electrodes 152 and 154 during a touch period.

Then, the organic light-emitting display device having the touchscreen displays an image through unit pixels during a display period. Each unit pixel may include red (R), green (G), and blue (B) subpixels SP, or may include red (R), green (G), blue (B), and white (W) subpixels SP, as illustrated. Alternatively, each unit pixel may be a combination of different colors of subpixels capable of displaying white.

The first and second touch electrodes 152 and 154 are disposed on the top portion of the encapsulation layer 140, and generate the mutual capacitance Cm at the neighboring portions thereof. In the organic light-emitting display device of the present disclosure, the first and second touch electrodes 152 and 154 include no separate base material or substrate, and are successively disposed on the encapsulation layer 140 without a separate adhesive layer therebetween. That is, when the encapsulation layer 140 covers the substrate 111 excluding the touch pad TP and the display pad DP, the first and second touch electrodes 152 and 154, which intersect each other, are formed on the encapsulation layer 140 through continuous processes. The first and second touch electrodes 152 and 154 serve to generate the mutual capacitance Cm for touch detection.

Meanwhile, each of the subpixels SP includes the pixel-driving circuit and the light-emitting element 120 connected to the pixel-driving circuit, as illustrated in the lower end of FIG. 2. In some cases, the light-emitting element 120 may be provided for each unit pixel including R, G and B subpixels, or R, G, B and W subpixels.

The pixel-driving circuit includes a switching thin-film transistor T1, a driving thin-film transistor T2, and a storage capacitor Cst.

The switching thin-film transistor T1 is turned on when a scan pulse is supplied to the scan line SL, and supplies a data signal supplied to the data line DL to the storage capacitor Cst and a gate electrode of the driving thin-film transistor T2.

The driving thin-film transistor T2 controls current I to be supplied from a high-voltage (VDD) supply line to the light-emitting element 120 in response to the data signal supplied to the gate electrode of the driving thin-film transistor T2, thereby adjusting the amount of emission of light from the light-emitting element 120. Then, even if the switching thin-film transistor T1 is turned off, the driving thin-film transistor T2 maintains the emission of light of the light-emitting element 120 by supplying a constant amount of current I thereto by a voltage charged in the storage capacitor Cst until a data signal of a next frame is supplied.

The driving thin-film transistor T2 or 130, as illustrated in FIG. 3, includes a gate electrode 132, a semiconductor layer 134 overlapping the gate electrode 132 with a gate insulation layer 112 therebetween, and source and drain electrodes 136 and 138 formed on an interlayer insulation layer 114 so as to come into contact with the semiconductor layer 134.

The light-emitting element 120 is disposed in the active area of the substrate 111, and includes an anode electrode 122, a light-emitting stack 124 formed on the anode electrode 122, and a cathode electrode 126 formed on the light-emitting stack 124.

The anode electrode 122 is electrically connected to the drain electrode 138 of the driving thin-film transistor 130, which is exposed through a pixel connection hole 148 formed in a planarization layer 118. The light-emitting stack 124 is formed on the anode electrode 122 in an emission area defined by a bank 128. The light-emitting stack 124 is formed by stacking a hole transport layer, an organic emission layer, and an electron transport layer on the anode electrode 122 in this order or in the reverse order. The cathode electrode 126 is formed so as to face the anode electrode 122 with the light-emitting stack 124 therebetween.

The encapsulation layer 140 prevents external moisture or oxygen from entering the light-emitting element 120. To this end, the encapsulation layer 140 includes a plurality of inorganic encapsulation layers 142 and 146 and an organic encapsulation layer 144 disposed between the inorganic encapsulation layers 142 and 146. The inorganic encapsulation layer 146 is the uppermost layer. Here, the inorganic encapsulation layers 142 and the organic encapsulation layer 144 of the encapsulation layer 140 are alternately disposed, and the encapsulation layer 140 includes at least two inorganic encapsulation layers 142 and 146 and at least one organic encapsulation layer 144. In the present disclosure, as the most basic structure, the structure of the encapsulation layer 140 in which the organic encapsulation layer 144 is disposed between the first and second inorganic encapsulation layers 142 and 146 will be described by way of example. In addition to the illustrated basic structure, the encapsulation layer 140 may further include at least one pair unit including a pair comprising an inorganic encapsulation layer and an organic encapsulation layer.

The first inorganic encapsulation layer 142 is formed on the substrate 111, on which the cathode electrode 126 has been formed, so as to be closest to the light-emitting element 120. The first inorganic encapsulation layer 142 is formed of an inorganic insulation material that is capable of being deposited at a low temperature, such as silicon nitride ($SiN_x$), silicon oxide ($SiO_x$), silicon oxide nitride (SiON), and aluminum oxide ($Al_2O_3$). Thus, since the first inorganic encapsulation layer 142 is deposited under a low-temperature atmosphere, it is possible to prevent damage to the light-emitting stack 124, which is vulnerable to a high-temperature atmosphere, during the deposition process of the first inorganic encapsulation layer 142.

The organic encapsulation layer 144 serves to dampen stress between the respective layers due to bending of the organic light-emitting display device and to increase planarization performance. The organic encapsulation layer 144 is formed using an organic insulation material, such as an acryl resin, epoxy resin, polyimide, polyethylene, and silicon oxycarbide (SiOC).

The second inorganic encapsulation layer 146 is formed on the substrate 111, on which the organic encapsulation layer 144 has been formed, so as to cover the upper surface and the side surface of the organic encapsulation layer 144. Thus, the second inorganic capsulation layer 146 minimizes or prevents external moisture or oxygen from entering the organic encapsulation layer 144. The second inorganic encapsulation layer 146 is formed of an inorganic insulation material, such as silicon nitride ($SiN_x$), silicon oxide ($SiO_x$), silicon oxide nitride (SiON), and aluminum oxide ($Al_2O_3$). The first and second inorganic encapsulation layers 142 and 146 may be formed of the same material, and may each include a plurality of layers.

The total thickness of the encapsulation layer 140 may range from 10 μm to 30 μm, in order to sufficiently prevent the introduction of external moisture and to prevent movement of inner particles and the influence of the inner particles.

Meanwhile, the encapsulation layer 140 is configured to cover at least the active area, and a side portion thereof is located in the non-active area. Here, note that the side portion of the encapsulation layer 140, which is exposed to the non-active area, is limited to an inorganic encapsulation layer, in order to effectively prevent the introduction of outside air. That is, the organic encapsulation layer 144 is located inside the inorganic encapsulation layers 142 and 146 thereabove and thereunder, and the second inorganic encapsulation layer 146 above the organic encapsulation layer 144 is lengthened beyond the organic encapsulation layer 144 so as to cover both the top portion and the side portion of the organic encapsulation layer 144 and to meet the side surface of the first inorganic encapsulation layer 142, which is also lengthened beyond the organic encapsulation layer 144.

In FIG. 1, the portion indicated by "CA" is a portion in which the encapsulation layer 140 is disposed. In the illustrated example, the encapsulation layer 140 exposes a portion of the non-active area in which the touch pad TP and the display pad DP are provided, but covers the active area AA and the remaining portion of the non-active area in which the touch pad TP and the display pad DP are not located. The reason why the encapsulation layer 140 is also disposed in the non-active area excluding the touch pad TP and the display pad DP is to prevent electrical interference and a short-circuit between a touch link wire (reference numeral 156 shown in FIGS. 3 and 4B) and a display link wire (reference numeral 137 shown in FIGS. 3 and 4A) because the display link wire 137, which is formed in a thin-film transistor formation process to connect each display pad DP to wires, such as the scan line SL and the data line DL, located in the active area AA on the substrate 111, is disposed in the non-active area, and because the touch link wire 156 is formed to overlap the display link wire 137. That is, the touch link wire 156 is disposed on the encapsulation layer 140, which covers the display link wire 137.

As illustrated in FIGS. 2 and 3, the first touch electrode 152 and the second touch electrode 154 are disposed on the encapsulation layer 140.

Meanwhile, in FIG. 1, the portion indicated by "LB" is a portion of the non-active area that is close to the touch pad TP and the display pad DP. The display link wire 137 and the touch link wire 156 converge on the display pad DP and the touch pad TP thereunder in the portion LB.

In the portion LB, the display pad DP includes a pad electrode layer, which is disposed in the same plane as the display link wire 137 on the substrate 111, so that the display link wire 137 is continuously connected to the pad electrode layer in the same plane in the portion LB. The touch pad TP includes a lower pad electrode layer formed on the substrate 111. Since the touch link wire 156 is disposed on the encapsulation layer 140, the touch link wire 156 is electrically connected to a pattern extending from the lower pad electrode layer of the touch pad TP in the portion LB.

Hereinafter, the configuration of the touch pad TP and the display pad DP, the configuration of the first and second touch electrodes 152 and 154, and the configuration of the respective link wires will be described based on the plan views.

Figure 4A:
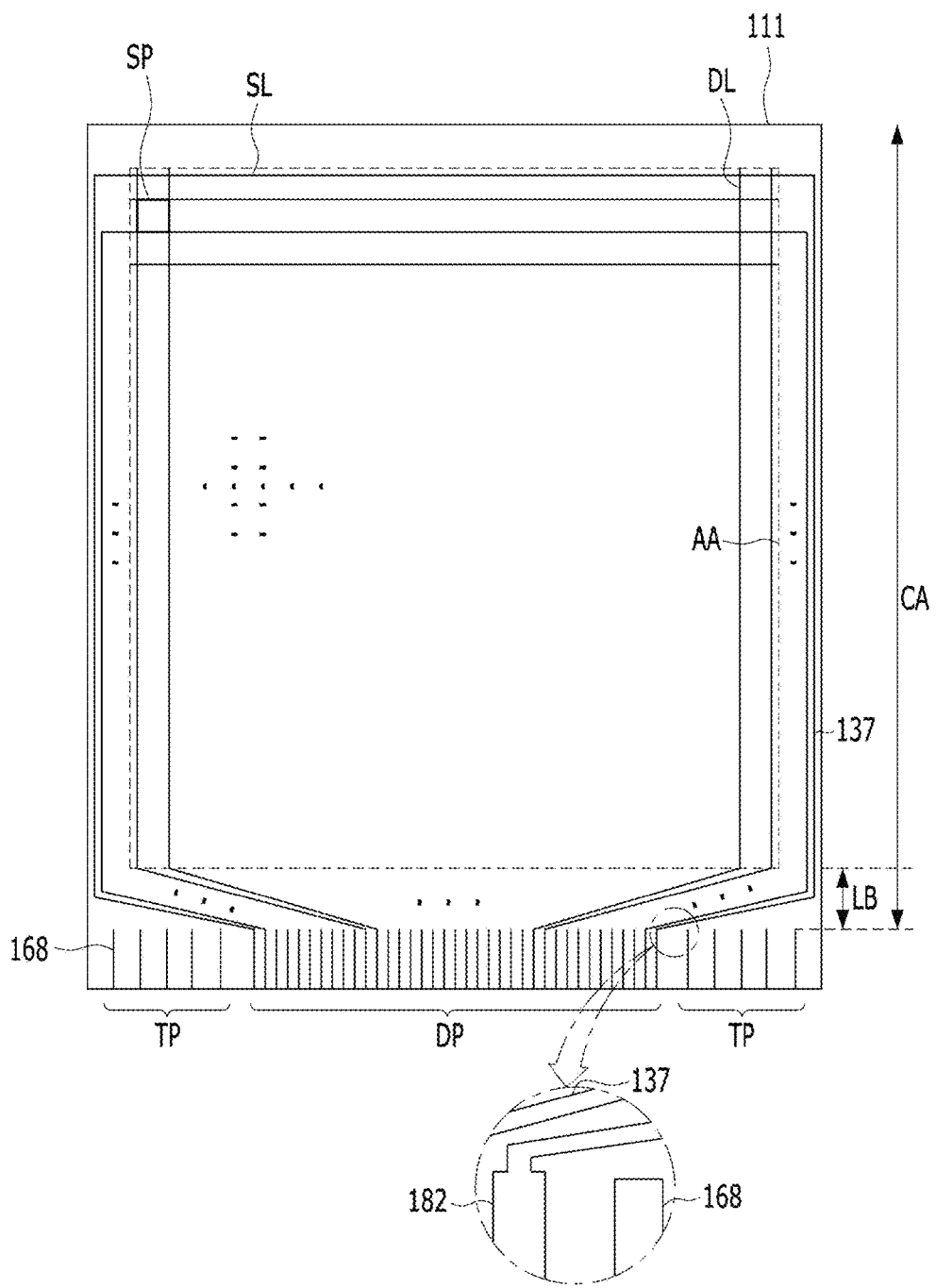
FIG. 4A is a plan view illustrating a first display pad electrode and the state after the first touch pad electrode are formed in the organic light-emitting display device having the touchscreen according to the present disclosure.
Figure 4B:
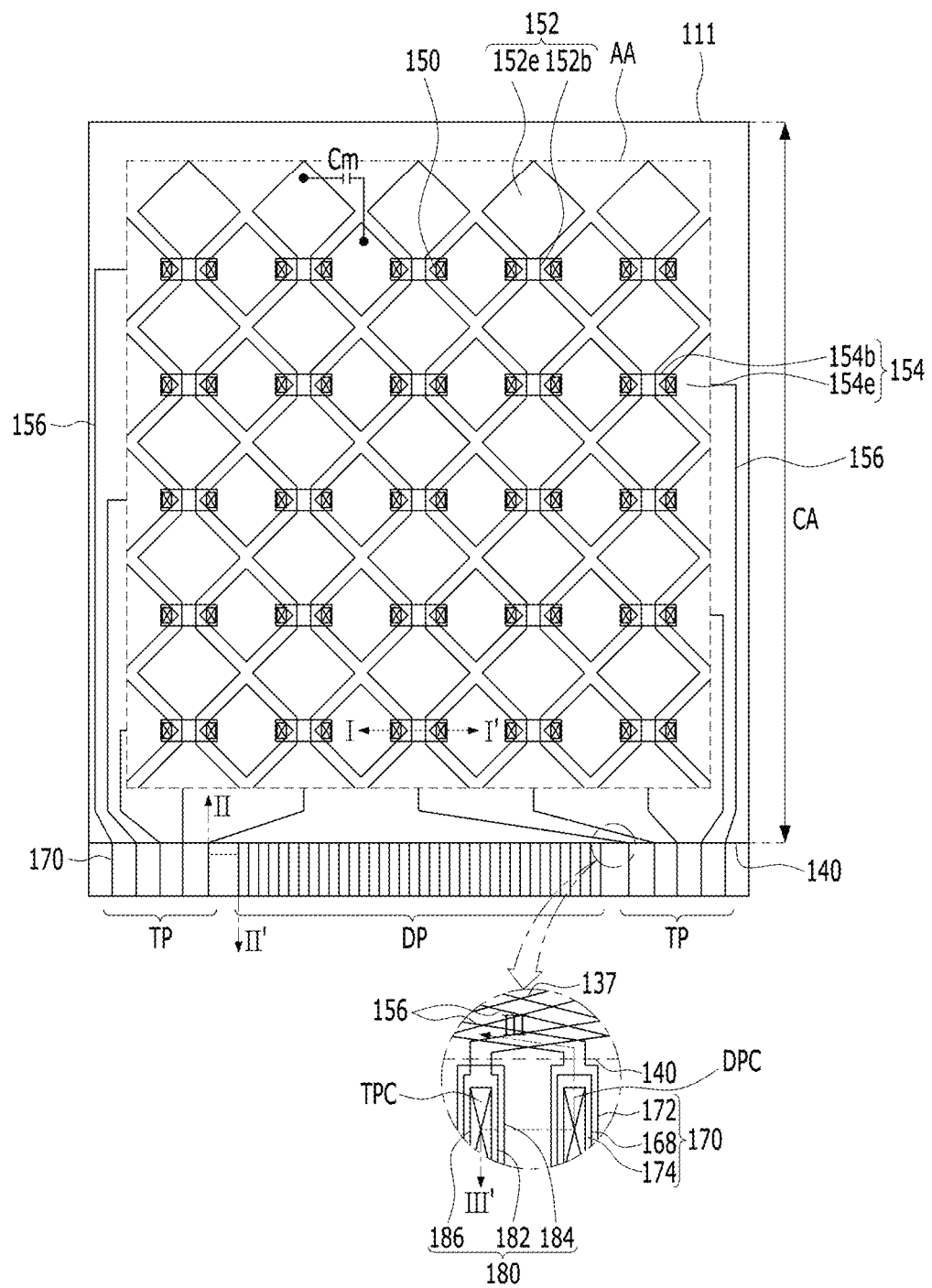
FIG. 4B is a plan view illustrating a second display pad electrode and the state after the second touch pad electrode are formed in the organic light-emitting display device having the touchscreen according to the present disclosure.

FIG. 4A is a plan view illustrating a first display pad electrode and the state after the first touch pad electrode are formed in the organic light-emitting display device having the touchscreen according to the present disclosure, and FIG. 4B is a plan view illustrating a second display pad electrode and the state after the second touch pad electrode are formed in the organic light-emitting display device having the touchscreen according to the present disclosure.

As illustrated in FIG. 4A, in the organic light-emitting display device having the touchscreen according to the present disclosure, a first touch pad electrode 168 of the touch pad TP and a first display pad electrode 182 of the display pad DP are formed through an array process of forming the scan line SL, the data line DL, the thin-film transistors T1 and T2 (FIG. 2), and the storage capacitor Cst in the active area AA. In this process, as illustrated in the enlarged view in the lower end portion of FIG. 4A, the display link wire 137 is integrally continuously formed with the first display pad electrode 182 using a metal in the same layer as the scan line SL or the data line DL. Meanwhile, the display link wire 137 may be formed by laminating two or more layers, or may be formed in different layers for respective regions, based on the layered structure of the scan line SL, the data line, the power supply voltage line VDD or VSS, or the like, which are disposed in the active area AA.

In contrast to this, the first touch pad electrode 168 of the touch pad TP is formed to have an island shape in the same layer as the scan line SL or the data line DL.

Here, as illustrated in FIG. 4A, the distance between a plurality of first touch pad electrodes 168 may be greater than the distance between a plurality of first display pad electrodes 182. This is because the number of scan lines SL and data lines DL disposed for each subpixel SP, in the active area AA is greater than the number of unit touch patterns (reference numerals 152e and 154e shown in FIG. 4B) of the first and second touch electrodes 152 and 154, which are required to sense a touch. Thus, the display pads DP are more densely arranged than the touch pads TP. However, the present disclosure is not limited thereto, and the touch pads TP and the display pads DP may be disposed at the same interval, or may be concentrated on a local portion (e.g., a center portion of one side of the substrate 111).

As illustrated in FIG. 4A, after a plurality of subpixels, each including a pixel-driving circuit, such as thin-film transistors and scan and data lines intersecting each other, as well as the first display pad electrode 182, the first touch pad electrode 168, and the display link wire 137 are formed on the substrate 111, the light-emitting element 120 (shown in FIG. 3) connected to the pixel-driving circuit is formed, and then the encapsulation layer 140 is formed to cover the aforementioned elements. At this time, a portion in which the touch pad TP and the display pad DP are provided is exposed from the encapsulation layer 140.

Subsequently, as illustrated in FIG. 4B, the first and second touch electrodes 152 and 154 are formed on the encapsulation layer 140.

The first and second touch electrodes 152 and 154 are arranged so as to intersect each other, one of the first and second touch electrodes 152 and 154 functioning as a touch-driving line, and the other one functioning as a touch-sensing line.

The first touch electrode 152 includes a plurality of first touch patterns 152*e* arranged in the Y-direction, and a first bridge 152*b*, which integrally interconnects the neighboring first touch patterns 152*e*. The second touch electrode 154 includes a plurality of second touch patterns 154*e* arranged in the X-direction, and a second bridge 154*b*, which is located in a layer different from the second touch patterns 154*e* and electrically interconnects neighboring second touch patterns 154*e*.

The first touch patterns 152*e* and the second touch patterns 154*e* are in the same layer. A touch insulation layer 158 is interposed between the second bridge 154*b* and the first and second touch patterns 152*e* and 154*e*.

The second bridge 154*b* is located in a layer different from the first and second touch patterns 152*e* and 154*e* with the touch insulation layer 158 (shown in FIG. 3) interposed therebetween at the intersection of the first and second touch electrodes 152 and 154, and is connected to the neighboring second touch patterns 154*e* through touch connection holes 150 formed in the touch insulation layer 158.

The first bridge 152*b* may be integrated with the neighboring first touch patterns 152*e*. FIG. 4B shows that the first bridge pattern 152*b* and the first touch pattern 152*e* are the same layer, and the second bride pattern 154*b* and the second touch pattern 154*e* are different layers. But a structure of the touch electrode array is not limited to FIG. 4B, it is possible that the first bridge pattern 152*b* and the first touch pattern 152*e* are different layers, and the second bride pattern 154*b* and the second touch pattern 154*e* are the same layer.

Here, each touch pad TP may include touch pad electrodes in multiple layers, and the touch link wire 156 may be formed simultaneously with the formation of the first and second touch electrodes 152 and 154, and may be located in the same layer as the second bridge 154*b*, as illustrated in FIG. 3. The touch link wire 156 may be lengthened to the touch pad TP so as to form a first connection pad electrode 172, which is superimposed on the first touch pad electrode 168. Here, the touch link wire 156 and the first connection pad electrode 172 are integrated with each other, and are formed together with the second bridge 154*b* of a touch electrode array. In the same layer as the first connection pad electrode 172, a second connection pad electrode 184 of the display pad DP, which has an island shape, may be formed so as to be superimposed on the first display pad electrode 182. The second connection pad electrode 184 may be omitted in some cases.

At the uppermost side of the touch pad TP or 170 and the display pad DP or 180, a second touch pad electrode 174 and a second display pad electrode 186 are located in the same layer as the first and second touch patterns 152*e* and 154, which are formed of a transparent conductive layer. As such, the touch pad TP or 170 includes the first touch pad electrode 168, the first connection pad electrode 172 lengthened from the touch link wire 156, and the second touch pad electrode 174, which are connected to each other in different layers. The display pad DP or 180 includes the first display pad electrode 182 in the same layer as the display link wire 137, the second connection pad electrode 184, and the second display pad electrode 186, which are connected to each other in different layers. Here, a portion of the touch pad TP or 170 for electrical connection of metals in different layers is referred to as a touch pad connector TPC, and a portion of the display pad DP or 180 for electrical connection of metals in different layers is referred to as a display pad connector DPC. The touch pad connector TPC and the display pad connector DPC respectively correspond to reference numerals 178*a* and 190 in the cross-sectional view of FIG. 3.

The structure of FIG. 4B illustrates an example in which the second touch electrode 154, which is horizontally disposed, includes the second touch patterns 154*e* and the second bridge 154*b*, which are disposed in different layers, but a structure in which the first touch electrode 152, which is vertically disposed, includes the first touch patterns 152*e* and the first bridge 152*b*, which are disposed in different layers, may be applied to the present disclosure.

In addition, in the structure of the first and second touch electrodes 152 and 154 illustrated in FIG. 3, the second bridge 154*b* is disposed below the first and second touch patterns 152*e* and 154*e*, but the present disclosure is not limited thereto, and a structure in which the second bridge 154 is disposed above the first and second touch patterns 152*e* and 154*e* may also be applied to the present disclosure.

The first and second touch patterns 152*e* and 154*e* are not limited to a single layer as illustrated. In some cases, in order to prevent RC delay and to increase touch sensitivity, a metal mesh pattern may be laminated on a touch pattern, which has a polygonal shape and a predetermined surface area, and is formed of a transparent electrode. In this case, the mesh pattern may be in contact with the top or bottom of the touch pattern formed of a transparent electrode, and in some cases, mesh patterns may be disposed respectively above and below the touch pattern formed of a transparent electrode. Alternatively, a touch pattern may be formed by laminating transparent electrodes having a predetermined area above and below a mesh pattern.

Here, the mesh pattern may be formed of at least one of Al, Ti, Cu, or Mo, or an alloy containing any one of them, and the transparent electrode may be formed of a transparent conductive layer such as indium tin oxide (ITO) and indium zinc oxide (IZO). In the case where the mesh pattern has a very small line width, even when the mesh pattern is located on the transparent electrode, it is possible to prevent deterioration in an aperture ratio or in transmissivity.

Meanwhile, the touch link wire 156 may be formed in the same layer as the second bridge 154*b*, which is formed of a metal in a layer different from the first and second touch patterns 152*e* and 154*e*. Alternatively, when a mesh pattern is provided, the touch link wire 156 may be provided in the same layer as the mesh pattern.

Considering in detail with reference to FIG. 3 the configuration of the completed touch pad TP after the first and second touch electrodes 152 and 154 are formed, it can be seen that the touch pad TP includes the first touch pad electrode 168 formed as a lowermost layer through an array process, and the second touch pad electrode 174 formed as an uppermost layer through the same process as the first and second touch patterns 152*e* and 154*e*. In the illustrated example, the touch link wire 156 is lengthened to the touch pad side so as to form the first connection pad electrode 172, which is connected at the upper and lower sides thereof to the first and second touch pad electrodes 168 and 174.

However, the connection pad electrode 172 may be selectively provided in the touch pad TP, and may be formed of a metal in a layer different from the touch link wire 156.

In addition, in the example illustrated in FIG. 3, to realize connection of the touch link wire 156 and the touch pad 170, the touch link wire 156 is lengthened to the touch pad 170 so that the first connection pad electrode 172 is formed in the same layer as the touch link wire 156 using a metal of the touch link wire 156. However, the touch link wire 156 needs not be used to form the first connection pad electrode 172 as long as the touch link wire 156 and the touch pad 170 are electrically connected to each other at some other position. In one example, one of the first touch pad electrode 168 and the second touch pad electrode 174, which constitute the touch pad 170, may be lengthened to the portion LB so as to overlap the touch link wire 156, and a connection hole may be formed at the overlapping position to enable the connection of the touch pad 170 and the touch link wire 156.

A specific connection method will be described below for each aspect.

In the same manner as the touch pad TP or 170, the layered structure of the display pad DP or 180 includes the first display pad electrode 182 in the same layer as the source and drain electrodes 136 and 138, the second connection pad electrode 184 in the same layer as the touch link wire 156, and the second display pad electrode 186 in the same layer as the first and second touch patterns 152e and 154e, which are sequentially laminated from the bottom thereof.

Thus, except that the touch pad TP or 170 includes the first connection pad electrode 172 integrated with the touch link wire 156, the touch pad TP or 170 and the display pad DP or 180 have the same layered structure, and therefore, may be connected to the single flexible printed circuit board 1500 located on the same side via an anisotropic conductive film 1600 without a difference in height between the touch pad TP or 170 and the display pad DP or 180 and the flexible printed circuit board 1500. Here, the flexible printed circuit board 1500 includes bump electrodes 1510 and 1520 respectively corresponding to the touch pad TP or 170 and the display pad DP or 180, and the bump electrodes 1510 and 1520 may be connected to a drive IC (not illustrated) or a control chip (not illustrated), which is provided in the flexible printed circuit board 1500, so as to receive an electrical signal therefrom. In addition, the anisotropic conductive film 1600 includes conductive balls 1610 mixed in an adhesive layer 1620. After the flexible printed circuit board 1500 is positioned on one side of the substrate 111 on which the display pad DP or 180 and the touch pad TP or 170 are disposed, when a predetermined pressure is applied to the anisotropic conductive film 1600 upon bonding, the inner conductive balls 1610 are broken, and the bump electrode 1510 or 1520 is electrically connected to the touch pad TP or 170 or the display pad DP or 180.

Meanwhile, in the organic light-emitting display device having the touchscreen according to the present disclosure, the touch pad 170 or TP and the display pad 180 or DP are aligned on the same side of the substrate 111, so that a region required for electrical connection of the substrate 111 and the flexible printed circuit board 1500 for receiving a signal is limited to one side of the substrate 111. Thus, since a region required for bonding between the flexible printed circuit board 1500 and the substrate 111 is limited to one side of the substrate 111, when the adhesive layer 1620 of the anisotropic conductive film 1600 is pushed and thus spreads by the pressure during bonding, the flexible printed circuit board 1500 is spaced apart from only one side of the active area AA of the substrate 111, which may simplify the physical configuration of a circuit unit on the substrate 111. Thus, a form factor may be improved. As a known flexible organic light-emitting display device in which a touchscreen is attached to an organic light-emitting panel, the touchscreen requires a touch pad, separately from a display pad for a light-emitting element or a thin-film transistor. Since the touch pad is located in a different plane from the display pad, additional connection of the display pad and a printed circuit board for the touchscreen has been require. However, the organic light-emitting display device having the touchscreen according to the present disclosure may unify such double printed circuit boards.

The mutual capacitance array Cm is formed at the neighboring portions of the first and second touch electrodes 152 and 154. Thus, the mutual capacitance array Cm serves as a touchscreen by storing charges in response to a touch driving pulse supplied to the first touch electrode 152 or the second touch electrode 154, which functions as a touch-driving line, and discharging the stored charge to the second touch electrode 154 or the first touch electrode 152, which functions as a touch-sensing line.

Meanwhile, the touch link wire 156 transmits a touch driving pulse, which is generated in a touch drive unit provided in the flexible printed circuit board 1500, to one of the first touch electrode 152 and the second touch electrode 154 via the touch pad 170, and transmits a touch signal generated from the other one to the touch pad 170. The touch link wire 156 is disposed between the touch pad 170 and the edge of each of the first and second touch electrodes 152 and 154 in the active area AA. When the touch link wire 156 is integrally formed with the bridge electrode or the first and second touch patterns, the touch link wire 156 is electrically connected to each of the first and second touch electrodes 152 and 154 without a separate connection hole.

The touch link wire 156 is formed in a single layer or in multiple layers using a highly conductive material having strong corrosion resistance and acid resistance, such as Al, Ti, Cu, or Mo. For example, the touch link wire 156 may be formed in a triple-layered structure as a stack of Ti/Al/Ti or Mo/Al/Mo, or may have a multilayer structure including a transparent conductive layer having strong corrosion resistance and acid resistance, such as ITO and IZO, and a highly conductive opaque conductive layer such as Ti/Al/Ti and Mo/Al/Mo.

Meanwhile, after the formation of the first and second touch electrodes 152 and 154, the touch link wire 156, the second touch pad electrode 174, and the second display pad electrode 186 described above, a touch barrier film may further be provided in a portion excluding the pad unit, in order to protect the surfaces of the first and second touch electrodes 152 and 154 and the touch link wire 156. The touch barrier film may be disposed in the portion CA of FIG. 1. The touch barrier film reinforces the function of the encapsulation layer 140, in addition to the first and second touch electrodes 152 and 154 and the touch link wire 156, thereby further preventing the light-emitting element 120 from being damaged by external moisture or the like. The touch barrier film is formed by applying an inorganic insulation layer onto an organic insulation film. An optical film (not illustrated), such as a circular polarizer or an OLED transmittance controllable film (OTF), may be disposed on the touch barrier film.

Hereinafter, other aspects of the present disclosure will be described. The following aspects are the same as the above-described first aspect in that the flexible printed circuit board 1500 is provided on the same side of the substrate 111 as the pad unit, but adopt modified configurations of the pad unit.

These aspects differ from each other in terms of the position of a connector of the touch link wire and the touch pad, but are the same in that the touch pad and the display pad have a layered structure of two or more layers.

Thus, the configuration of the active area, which has the same structure as that in the organic light-emitting display device having the touchscreen according to the above-described first aspect, will be omitted for convenience of description, and the following description is mainly based on the pad unit, which differs from that in the first aspect.

Figure 5:
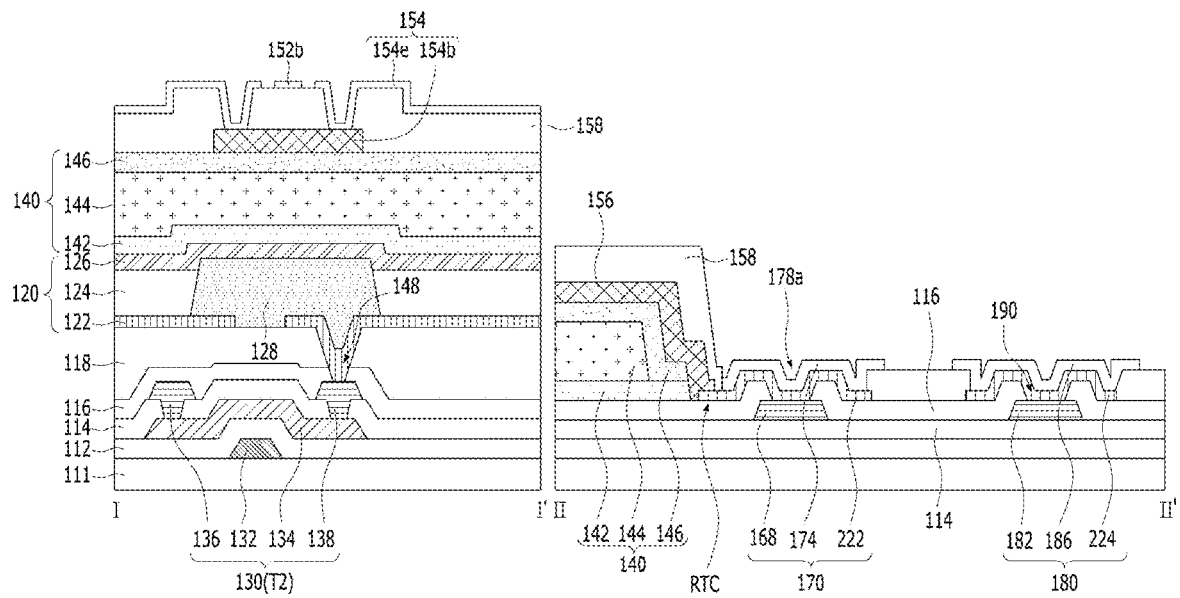
FIG. 5 is a cross-sectional view separately illustrating a portion of the active area and the pad unit in the organic light-emitting display device having the touchscreen according to a second aspect of the present disclosure.

FIG. 5 is a cross-sectional view separately illustrating a portion of the active area and the pad unit in the organic light-emitting display device having the touchscreen according to a second aspect of the present disclosure.

As illustrated in FIG. 5, in the organic light-emitting display device having the touchscreen according to the second aspect of the present disclosure, the touch pad 170 and the display pad 180 have the same triple-layered structure, but each of first and second connection pad electrodes 222 and 224 is formed of the same layer as the anode electrode 122 of the light-emitting element 120, unlike the first aspect.

That is, the touch pad 170 includes the first touch pad electrode 160, which is in the same layer as the data line DL and the source and drain electrodes 136 and 138, the first connection pad electrode 222, which is in the same layer as the anode electrode 122, and the second touch pad electrode 174, which is in the same layer as the first and second transparent touch patterns 152e (or 152b) and 154e, which are sequentially laminated from the bottom. The display pad 180 includes the first display pad electrode 182, which is in the same layer as the data line DL and the source and drain electrodes 136 and 138, the second connection pad electrode 224, which is in the same layer as the anode electrode 122, and the second display pad electrode 186, which is in the same layer as the first and second touch patterns 152 (or 152b) and 154e, which are laminated in sequence from the bottom side. The touch pad 170 and the display pad 180 have the same layered structure.

The first connection pad electrode 222 is lengthened from the touch pad 170 into the touch insulation layer 158 for electrical connection with the touch link wire 156, and is electrically connected to the touch link wire 156 at a position at which it overlaps the touch link wire 156. The portion indicated by "RTC" is a portion in which the touch link wire 156 and the first connection pad electrode 222 are electrically connected to each other.

In this case, a flexible printed circuit board (not illustrated) may be connected to the touch pad 170 and the display pad 180, which are located in the same layer on the same side of the substrate 111, without a difference in height therebetween.

In some cases, the second connection pad electrode 224 of the display pad 180 may be omitted. In this case, since the second connection pad electrode 224 may have a thickness of approximately 1 μm or less, more particularly, a thickness of 5000 Å or less, even when the second connection pad electrode 224 is omitted, the display pad 180 may not have a large difference in height from the neighboring touch pad 170. Thus, even when all of the flexible printed circuit board, the touch pad 170, and the display pad 180 are bonded to each other, bonding reliability may be maintained.

When the first connection pad electrode 222 is omitted together with the second connection pad electrode 224, in a process of patterning the touch insulation layer 158, after a connection hole is formed to expose one side of the touch link wire 156, the second touch pad electrode 174 is lengthened so as to be connected to the exposed touch link wire 156, so that the touch link wire 156 and the touch pad TP may be connected to each other.

Figure 6:
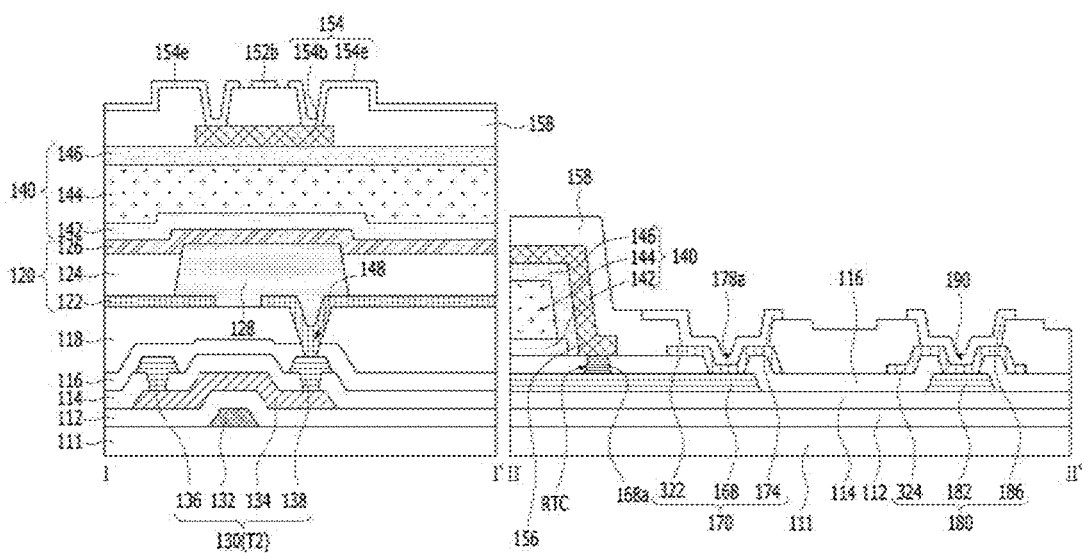
FIG. 6 is a cross-sectional view separately illustrating a portion of the active area and the pad unit in the organic light-emitting display device having the touchscreen according to a third aspect of the present disclosure.

FIG. 6 is a cross-sectional view separately illustrating a portion of the active area and the pad unit in the organic light-emitting display device having the touchscreen according to a third aspect of the present disclosure.

As illustrated in FIG. 6, as compared with the second aspect, in the organic light-emitting display device having the touchscreen according to the third aspect of the present disclosure, the first touch pad electrode 168 is lengthened from the touch pad 170 so as to overlap the touch link wire 156, and an overlapping portion of the first touch pad electrode 168 and the touch link wire 156 is subjected to laser welding in order to melt a metal material of the welding portion, so that an electrical connector RTC of the first touch pad electrode 168 and the touch link wire 156 is formed. Here, the portion indicated by reference numeral 168a has the same material as that of the first touch pad electrode 168. In this case, the substrate 111 may be formed of a transparent material that is stable for laser irradiation and is permeable. The protective layer 116 between the touch link wire 156 and the first touch pad electrode 168 may be an inorganic layer that has a small thickness suitable for selective burning using laser irradiation energy. Here, the electrical connector RTC between the touch link wire 156 and the first touch pad electrode 168 is located in the protective layer 116 between the first touch pad electrode 168 and the touch link wire 156, and is located above the first touch pad electrode 168 and below the touch link wire 156.

Meanwhile, a method of forming the electrical connector RTC between the touch link wire 156 and the first touch pad electrode 168 is not limited to laser welding. In the case in which there is an additional process of forming an insulation layer and a hole therein after the encapsulation layer 140 is formed and before the touch link wire 156 is formed, the electrical connector RTC may be patterned by a photolithography method in the corresponding process.

Note that a portion in which the electrical connector is formed is limited to a portion in which the first touch pad electrode 168 does not overlap the display link wire 137.

Here, first and second connection pad electrodes 322 and 324 may be omitted from each of the touch pad 170 and the display pad 180. In the case of omission thereof, the second touch pad electrode 174 and the second display pad electrode 186 may be directly connected to each of the first touch pad electrode 168 and the second display pad electrode 182 thereunder.

In some cases, the electrical connector RTC between the touch link wire 156 and the touch pad 170 may be provided in the touch link wire 156. In such cases, the second touch pad electrode 174 may be lengthened to the touch link wire 156 and a connection hole may be formed in an overlapping portion of the second touch pad electrode 174 and the touch link wire 156 in the touch insulation layer 158, so that the electrical connector RTC may be formed through the connection hole.

Hereinafter, a method of manufacturing the organic light-emitting display device having the touchscreen according to the present disclosure will be described for each aspect.

*Manufacturing Method of First Aspect*

FIGS. 7A to 7E are process cross-sectional views illustrating a method of manufacturing the organic light-emitting display device having the touchscreen according to the first aspect of the present disclosure.

Figure 7A:
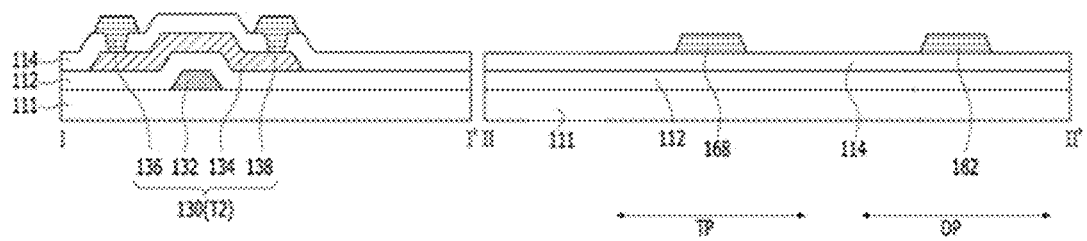
FIGS. 7A to 7E are process cross-sectional views illustrating a method of manufacturing the organic light-emitting display device having the touchscreen according to the first aspect of the present disclosure.

As illustrated in FIG. 7A, the switching thin-film transistor (see T1 in the pixel-driving circuit of FIG. 2) and the driving thin-film transistor T2 or 130 are formed in each subpixel of the substrate 111.

Specifically, by selectively patterning a metal material, the scan line SL is formed in the first direction on the active area of the substrate 111, and the gate electrode 132 is formed for each subpixel SP so as to be connected to the scan line SL or to have an island shape.

Subsequently, the gate insulation layer 112 is formed so as to cover the gate electrode 132, and the semiconductor layer 134 is formed on the gate insulation layer 112 so as to overlap the gate electrode 132. Then, the interlayer insulation layer 114 is formed over the entire surface thereof.

Subsequently, the interlayer insulation layer 114 is selectively removed to expose opposite ends of the semiconductor layer 134.

Subsequently, by selectively patterning a metal material, the data line DL is formed in a direction intersecting the scan line SL, and the source and drain electrodes 136 and 138 are formed so as to be connected to opposite ends of the semiconductor layer 134. In the same process, the first touch pad electrode 168 and the first display pad electrode 182 are formed in the non-active area that corresponds to one side of the substrate 111. In the same process, as illustrated in FIG. 4A, the display link wire 137 is formed so as to extend from the data line DL or the scan line SL. When the display link wire 137 is formed so as to extend from the scan line SL, the first display pad electrode 182 and the display link wire 137 may be located in the same layer as the gate electrode 132.

Figure 7B:
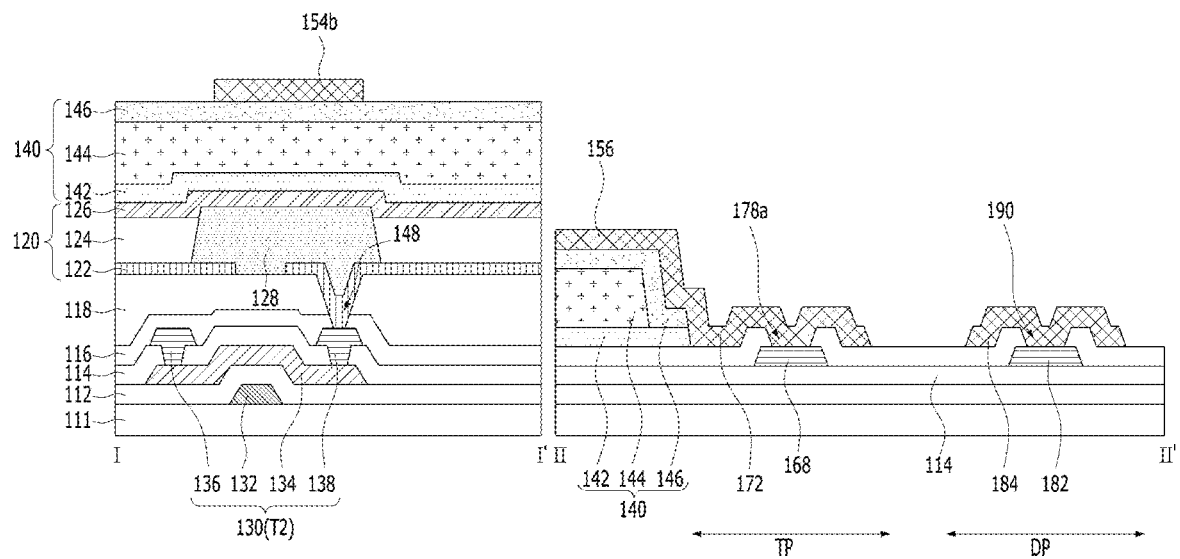

Subsequently, as illustrated in FIG. 7B, the protective layer 116 formed of an inorganic layer is formed over the entire surface thereof.

Subsequently, the planarization layer 118 is formed using an organic layer such as photo-acryl, so as to cover the first touch pad electrode 168, the first display pad electrode 182, the switching thin-film transistor, and the driving thin-film transistor T2 or 130, in order to planarize the structure thereunder and to allow the light-emitting element to be formed on the flat top surface thereof. At this time, the planarization layer 118 is removed in the non-active area in order to prevent separation of, for example, the pad unit due to the planarization layer during a bonding process or a repair process.

Subsequently, the planarization layer 118 and the protective layer 116 are selectively removed to form the pixel connection hole 148, which exposes the drain electrode 138. In this process, the planarization layer may be removed from the pad unit. At this time, the first touch pad connection hole 178*a* and the first display pad connection hole 190 are formed in the pad unit.

Subsequently, the anode electrode 122, the bank 128, the light-emitting stack 124, and the cathode electrode 126 are sequentially formed on the planarization layer 118. Here, the anode electrode 122, the light-emitting stack 124, and the cathode electrode 126 function as the light-emitting element 120.

The encapsulation layer 140 is formed by alternately laminating the inorganic encapsulation layers 142 and 146 and the organic encapsulation layer 144 on the substrate 111, on which the cathode electrode 126 has been formed. Here, in order to sufficiently cover the light-emitting element 120 thereunder, the encapsulation layer 140 covers the entire active area AA, and is lengthened to the non-active area excluding the pad unit so as to cover the display link wire 137, which is formed in advance (see FIG. 4B).

Subsequently, the second bridge 154*b* is formed in a single layer or in multiple layers using a metal having strong corrosion resistance and acid resistance, such as Al, Ti, Cu, or Mo, on the uppermost inorganic encapsulation layer 146 of the encapsulation layer 140 to have an island shape, and simultaneously, the touch link wire 156 is formed in the non-active area. The touch link wire 156 is lengthened to the touch pad 170 located outside the encapsulation layer 140 so as to form the first connection pad electrode 172, which overlaps the first touch pad electrode 168 and is connected thereto through the first touch pad connection hole 178*a*. Then, the second connection pad electrode 184 is formed so as to be spaced apart from the first connection pad electrode 172 and to be connected to the first display pad electrode 182 through the first display pad connection hole 190.

Specifically, after a first conductive layer is deposited over the entire surface of the substrate 111, on which the encapsulation layer 140 has been formed, through a deposition process using sputtering at room temperature, the first conductive layer is patterned through a photolithography process and an etching process, so that the touch link wire 156, the first connection pad electrode 172, and the second connection pad electrode 184 are formed. Here, the first conductive layer is formed in a single layer or in multiple layers using a metal having strong corrosion resistance and acid resistance, such as Al, Ti, Cu, or Mo. For example, the first conductive layer may be a triple-layered structure as a stack of Ti/Al/Ti or Mo/Al/Mo.

Since the second connection pad electrode 184 prevents the first display pad electrode 182 from being exposed, and the first connection pad electrode 172 prevents the first touch pad electrode 168 from being exposed, it is possible to prevent the first touch pad electrode 168 and the first display pad electrode 182 from being damaged by an etching solution, which is added in a subsequent process of forming the first and second touch patterns 152*e* and 154*e* or the first bridge 152*b*. However, since the protection of the first touch pad electrode 168 and the first display pad electrode 182 is adjustable based on the selected type of etching solution or the etching rate in the subsequent etching process, the first and second connection pad electrodes 172 and 184 may not be provided, and may be replaced with the anode electrode 122 or the cathode electrode 126 of the light-emitting element 120. However, in the first aspect of the present disclosure, the first connection pad electrode 172 is integrally formed with the touch link wire 156, and it is meaningful to connect the first touch pad electrode 168 to the touch link wire 156 on the encapsulation layer 140, which are formed in different processes.

Figure 7C:
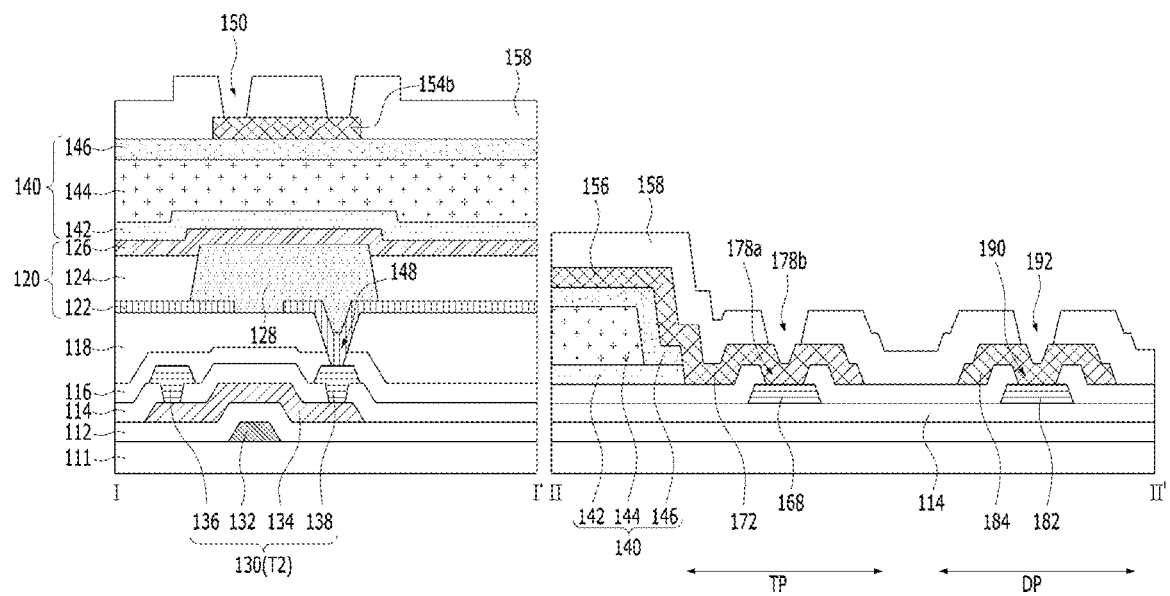

Subsequently, as illustrated in FIG. 7C, the touch insulation layer 158 is deposited to have a thickness ranging from 500 Å to 5 μm through a deposition or coating process over the entire surface including the second bridge 154*b*, the touch link wire 156, and the first and second connection pad electrodes 172 and 184. Then, to expose opposite ends of the top portion of the second bridge 154*b* and the top portion of the first and second connection pad electrodes 172 and 184, the touch connection holes 150, the second touch pad connection hole 178*b*, and the second display pad connection hole 192 are formed.

Here, the touch insulation layer 158 may be an organic layer or an inorganic layer, which may be formed through a low-temperature process. When the touch insulation layer 158 is formed of an organic layer, the touch insulation layer 158 is formed by coating the substrate with an organic layer, and thereafter curing the organic layer at a temperature of 100° C. or less in order to prevent damage to the light-emitting stack 124, which is vulnerable to a high temperature. When the touch insulation layer 158 is formed of an inorganic layer, the touch insulation layer 158 having a multilayer structure is formed by performing a low-temperature CVD deposition process and a cleaning process at least two times in order to prevent damage to the light-emitting stack 124, which is vulnerable to a high temperature. Subsequently, by patterning the touch insulation layer 158 through a photolithography process and an etching process, the touch connection holes 150, the second touch pad connection hole 178*b*, and the second display pad connection hole 192 are provided. Here, the first touch pad connection hole 178*a* and the second touch pad connection hole 178*b* are at substantially the same position, and the first display pad connection hole 190 and the second display pad connection hole 192 are at substantially the same position. As such, the second touch pad connection hole 178*b* and the second display pad connection hole 192 are located respectively above the first touch pad connection hole 178*a* and the first display pad connection hole 190.

Figure 7D:
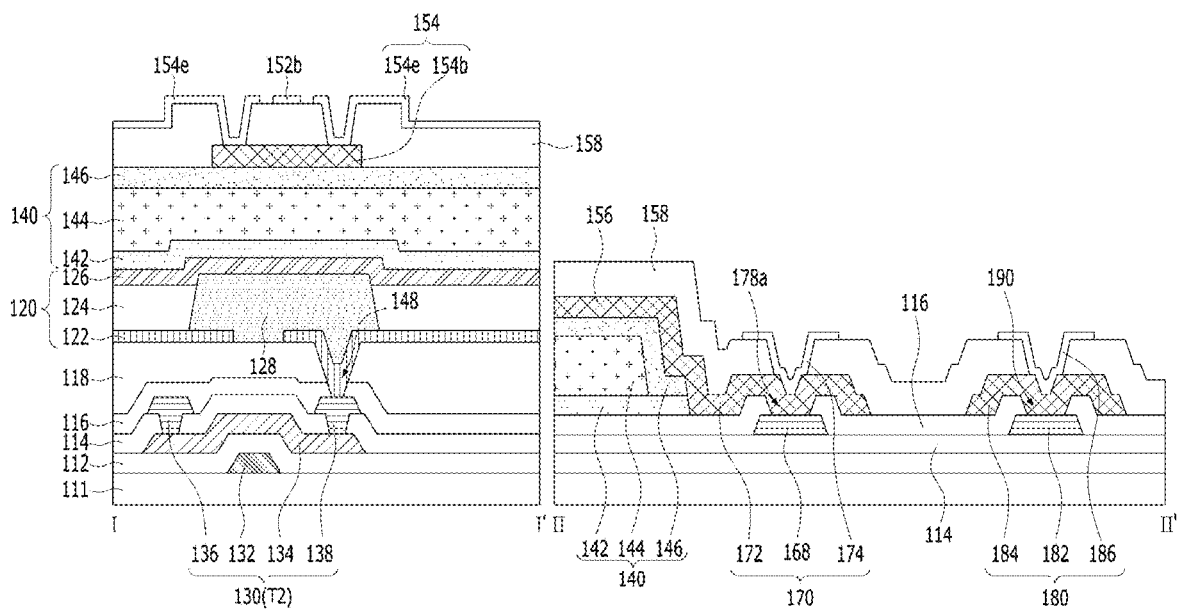

Subsequently, as illustrated in FIG. 7D, by depositing a second conductive layer on the touch insulation layer 158 including the touch connection holes 150, the second touch pad connection hole 178*b*, and the second display pad connection hole 192, and then selectively removing the same, in the active area, each second touch pattern 154*e*, which is connected to the second bridge 154*b* through the touch connection hole 150, each first touch pattern (see 152*e* of FIG. 4B), which is spaced apart from the second touch pattern 154*e* and is arranged in a direction intersecting the second touch pattern 154*e*, and the first bridge 152*b*, which integrally interconnects neighboring first touch patterns 152*e*, are formed. In addition, the second touch pad electrode 174, which is connected to the first connection pad electrode 172 thereunder through the second touch pad connection hole 178*b*, and the second display pad electrode 186, which is connected to the second connection pad electrode 184 thereunder through the second display pad connection hole 192, are formed.

Here, the second conductive layer may be formed using a transparent conductive layer, such as ITO or IZO, or a metal having strong corrosion resistance and acid resistance, such as Al, Ti, Cu, and Mo, or may be formed by laminating the aforementioned conductive layer or metal in two or more layers. The second conductive layer is formed by a deposition method such as sputtering at room temperature. In this case, since the second touch pad electrode 174 and the second display pad electrode 186, which form uppermost electrodes of the touch pad TP and the display pad DP, are formed using the second conductive layer, in order to prevent surface corrosion and achieve stability, the second conductive layer may include a single transparent conductive layer such as ITO and IZO, or may include an upper transparent conductive layer, such as ITO and IZO, when it is formed in multiple layers.

Through the process described above, the touch pad TP or 170 has a triple-layered structure including the first touch pad electrode 168, the first connection pad electrode 172, and the second touch pad electrode 174, which are sequentially laminated from the bottom, and the display pad DP or 180 has a triple-layered structure including the second display pad electrode 182, the second connection pad electrode 184, and the second display pad electrode 186, which are sequentially laminated from the bottom and are respectively formed in the same layers as those of the touch pad TP or 180.

Figure 7E:
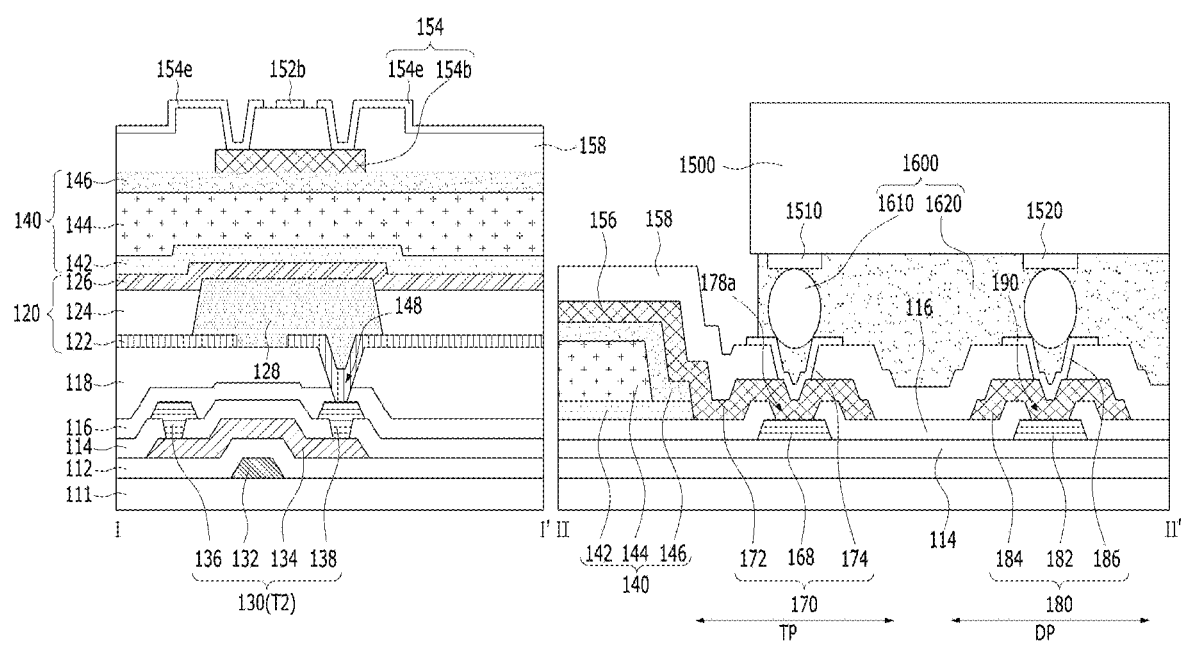

Subsequently, as illustrated in FIG. 7E, in order to apply an electrical signal to the scan line SL, the data line DL, and the first and second touch electrodes 152 and 154, the printed circuit board 1500, which includes a drive IC and a touch controller therein, is provided. At this time, the printed circuit board 1500 includes the bump electrodes 1510 and 1520 at positions corresponding to the touch pad TP or 170 and the display pad DP or 180. The anisotropic conductive film 1600 is interposed between the printed circuit board 1500 and the pad unit PT and DP of the substrate 111 to achieve electrical connection when pressure is applied to the back side of the flexible printed circuit board 1500.

Here, in the anisotropic conductive film 1600, the conductive balls 1610 are mixed in the adhesive layer 1620. When pressure is applied thereto, the conductive balls 1610 are broken so as to achieve electrical connection between the bump electrode 1510 or 1520 and the touch pad 170 or the display pad 180 located thereabove and thereunder.

In this way, in the organic light-emitting display device having the touchscreen according to the first aspect of the present disclosure, before the encapsulation layer 140 is formed, the first touch pad electrode 168 having an island shape and the first display pad electrode 182 connected to the display link wire 137 are provided. Then, after the encapsulation layer 140 is formed, in the process of forming the first and second touch electrodes, the second touch pad electrode 174 and the second display pad electrode 186 are formed so as to be respectively connected to the first touch pad electrode 168 and the touch link wire 156. Thereby, by applying the same pad structure to different types of pads TP and DP, the pads TP and DP may be connected to the flexible printed circuit board 1500 without a difference in height therebetween.

In addition, in the organic light-emitting display device having the touchscreen according to the present disclosure, since the encapsulation layer 140 is located between the display link wire 137, which is used to interconnect the display pad DP, the thin-film transistor, the scan line SL, and the data line DL, and the touch link wire 156, which interconnects the touch pad TP and the first and second touch electrodes 152 and 154, electrical interference between the link wires 137 and 156 may be prevented, so that the thin-film transistor, the light-emitting element 120, and the first and second touch electrodes 152 and 154 may be driven without interference therebetween even if they overlap each other when viewed in plan.

In addition, the touch link wire 156 is lengthened to the touch pad so as to form a pad electrode, thereby not only functioning as an auxiliary pad electrode but also electrically connecting the first and second touch electrodes 152 and 154, which are formed in a touch electrode array formation process, to the first touch pad electrode 168, which is formed in a different array process.

The manufacturing methods of the following aspects will be described only based on differences from the manufacturing method of the first aspect, and a description of the same parts will be omitted.

*Manufacturing Method of Second Aspect*

FIGS. 8A to 8D are process cross-sectional views illustrating a method of manufacturing the organic light-emitting display device having the touchscreen according to the second aspect of the present disclosure.

Figure 8A:
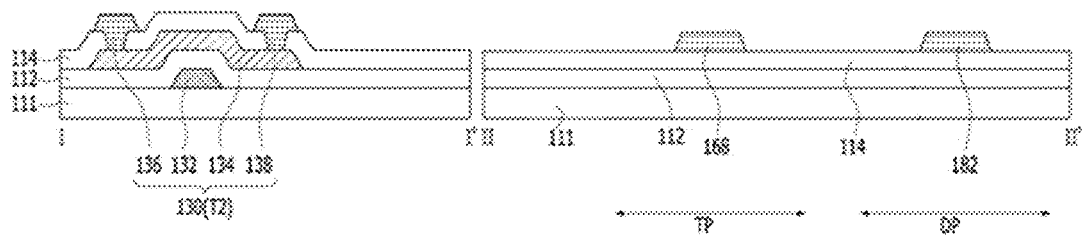
FIGS. 8A to 8D are process cross-sectional views illustrating a method of manufacturing the organic light-emitting display device having the touchscreen according to the second aspect of the present disclosure.

As illustrated in FIG. 8A, in a method of manufacturing the organic light-emitting display device having the touchscreen according to the second aspect of the present disclosure, first, the switching thin-film transistor (shown as T1 in the pixel-driving circuit of FIG. 2) and the driving thin-film transistor T2 or 130 are formed in each subpixel SP of the substrate 111. In this process, the first touch pad electrode 168 and the first display pad electrode 182, which are spaced apart from each other, are formed in the same layer as the source and drain electrodes 136 and 138 and the data line (shown as DL of FIG. 4A).

Subsequently, the protective layer 116 is formed using an inorganic layer over the entire surface thereof.

Subsequently, the planarization layer 118 is formed using an organic layer such as photo-acryl, so as to cover the first touch pad electrode 168, the first display pad electrode 182, the switching thin-film transistor, and the driving thin-film transistor T2 or 130, in order to planarize the structure thereunder and to form the light-emitting element on the top flat surface thereof. At this time, the planarization layer 118 is removed in the non-active area in order to prevent separation of, for example, the pad unit due to the planarization layer during a bonding process or a repair process.

Subsequently, the planarization layer 118 and the protective layer 116 are selectively removed to form the pixel connection hole 148, which exposes the drain electrode 138. In this process, the first touch pad connection hole 178a and the first display pad connection hole 190 are formed in the pad unit.

Figure 8B:
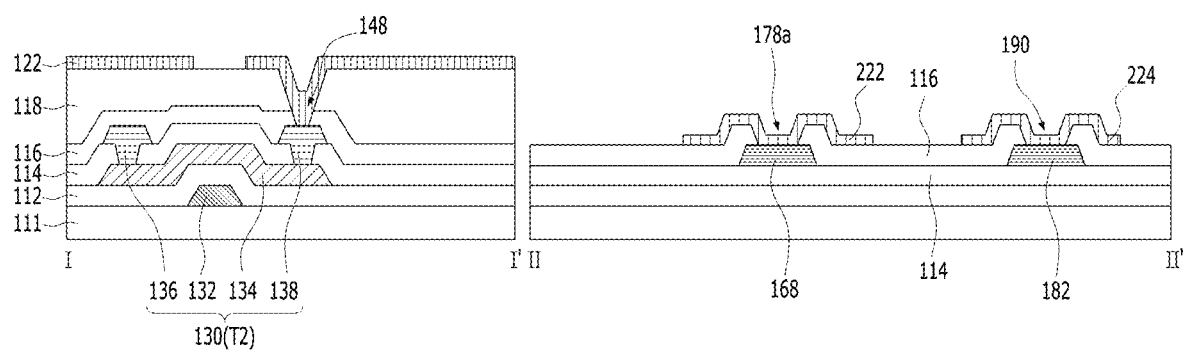

Subsequently, as illustrated in FIG. 8B, by depositing a first conductive layer, which is a reflective electrode, a transparent electrode, or a lamination thereof, on the planarization layer 118 and the pad unit from which the planarization layer 118 has been removed, and selectively removing the same, the anode electrode 122 is formed for each subpixel SP, the first connection pad electrode 222 is formed so as to be connected to the first touch pad electrode 168 through the first touch pad connection hole 178a, and the second connection pad electrode 224 is formed so as to be connected to the first display pad electrode 182 through the first display pad connection hole 190.

Subsequently, the bank 128, a portion of which overlaps the anode electrode 122 to define an emission area, is formed, and the light-emitting stack 124 including the emission layer and the cathode electrode 126 are sequentially formed. Here, the anode electrode 122, the light-emitting stack 124, and the cathode electrode 126 function as the light-emitting element 120.

The encapsulation layer 140 is formed by alternately laminating the inorganic encapsulation layers 142 and 146 and the organic encapsulation layer 144 on the substrate 111, on which the cathode electrode 126 has been formed. Here, in order to sufficiently cover the light-emitting element 120 thereunder, the encapsulation layer 140 covers the entire active area AA, and is lengthened to the non-active area excluding the pad unit so as to cover the display link wire 137, which is formed in advance (shown in FIG. 4B).

Figure 8C:
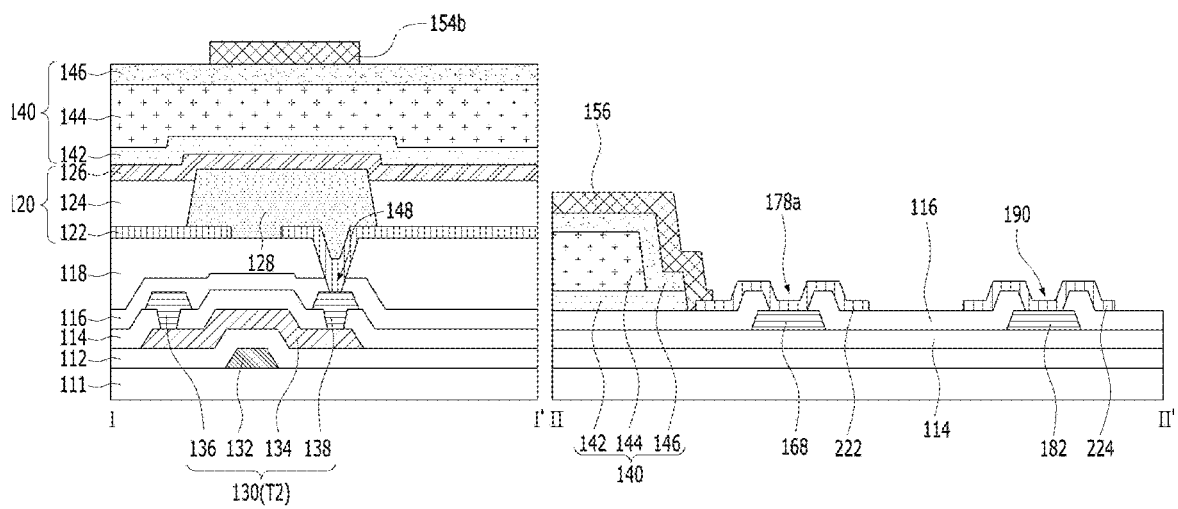

Subsequently, as illustrated in FIG. 8C, the second bridge 154b is formed in a single layer or in multiple layers to have an island shape by using a metal having strong corrosion resistance and acid resistance, such as Al, Ti, Cu, or Mo, on the uppermost inorganic encapsulation layer 146 of the encapsulation layer 140, and simultaneously, the touch link wire 156 is formed in the non-active area. At this time, the touch link wire 156, which extends along the sidewall of the encapsulation layer 140 and enters the non-active area, overlaps one side of the first connection pad electrode 222 and is electrically connected thereto.

Figure 8D:
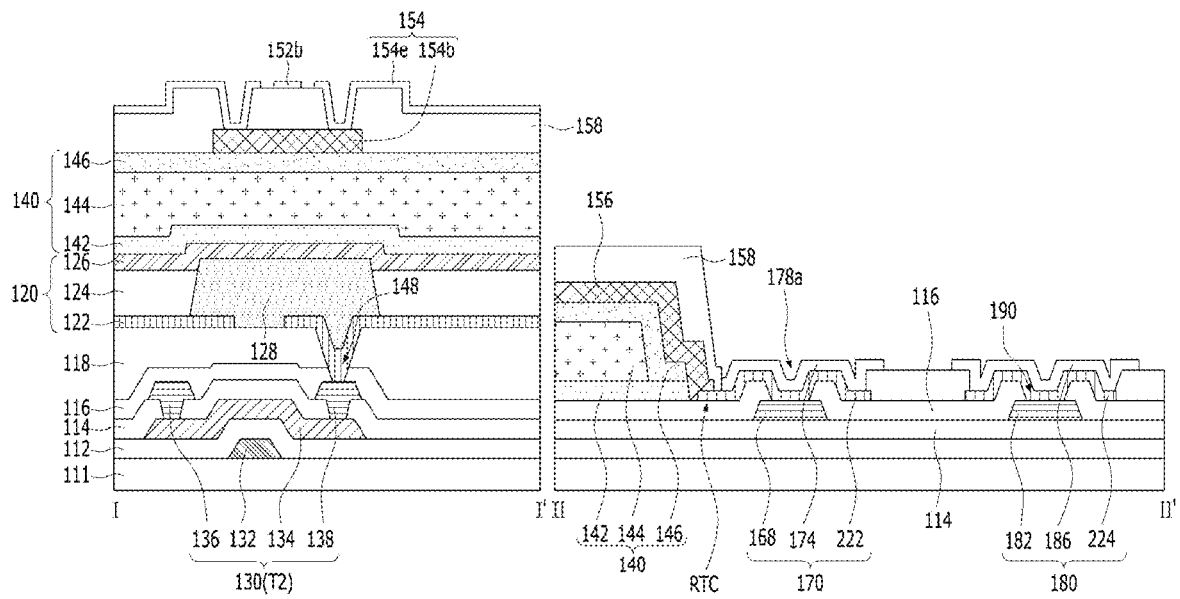

Subsequently, as illustrated in FIG. 8D, the touch insulation layer 158 is deposited to have a thickness ranging from 500 Å to 5 μm through a deposition or coating process over the entire surface including the second bridge 154b, the touch link wire 156, and the first and second connection pad electrodes 222 and 224. Then, to expose opposite ends of the second bridge 154b and the top portion of the first and second connection pad electrodes 222 and 224, the touch connection holes 150, and connection holes at the same positions as the first touch pad connection hole 178a and the first display pad connection hole 190 are formed in the touch insulation layer 158.

Subsequently, by depositing a second conductive layer on the touch insulation layer 158 including the touch connection hole 150, the first touch pad connection hole 178a, and the first display pad connection hole 190, and then selectively removing the same, in the active area, each second touch pattern 154e, which is connected to the second bridge 154b through the touch connection hole 150, each first touch pattern (shown as 152e of FIG. 4B), which is spaced apart from the second touch pattern 154e and is arranged in a direction intersecting the second touch pattern 154e, and the first bridge 152b, which integrally interconnects neighboring first touch patterns 152e, are formed. In addition, the second touch pad electrode 174, which is connected to the first connection pad electrode 222 thereunder through the first touch pad connection hole 178a, and the second display pad electrode 186, which is connected to the second connection pad electrode 224 thereunder through the first display pad connection hole 190, are formed.

*Manufacturing Method of Third Aspect*

FIGS. 9A to 9G are process cross-sectional views illustrating a method of manufacturing the organic light-emitting display device having the touchscreen according to the third aspect of the present disclosure.

Figure 9A:
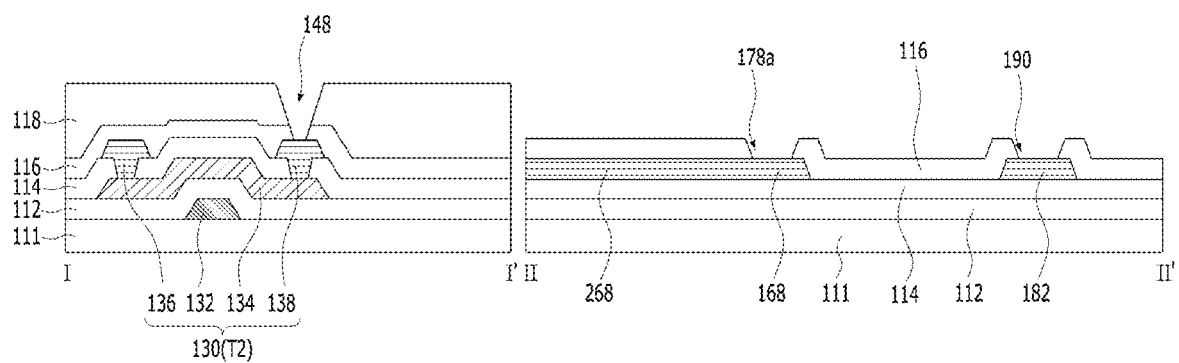
FIGS. 9A to 9G are process cross-sectional views illustrating a method of manufacturing the organic light-emitting display device having the touchscreen according to the third aspect of the present disclosure.

As illustrated in FIG. 9A, in a method of manufacturing the organic light-emitting display device having the touchscreen according to the third aspect of the present disclosure, first, the switching thin-film transistor (shown as T1 in the pixel-driving circuit of FIG. 2) and the driving thin-film transistor T2 or 130 are formed in each subpixel SP of the substrate 111. In the same process, the first touch pad electrode 168, which is in the same layer as the data line (shown as DL of FIG. 4A) and the source and drain electrodes 136 and 138, and the first display pad electrode 182, which is spaced apart from the first touch pad electrode 168, are formed. The first touch pad electrode 168 is lengthened to the portion LB illustrated in FIGS. 1 and 4a in the non-display area to have a pattern line shape having a constant width. In this case, a lengthened portion of the first touch pad electrode 168 is disposed so as not to overlap the display link wire 137, which is formed in the same process.

In some cases, the first touch pad electrode 168 and the first display pad electrode 182 may be formed using different metal layers. In this case, one of them may be in the same layer as the scan line SL and the gate electrode 132, and the other one may be in the same layer as the data line DL and the source and drain electrodes 136 and 138. This serves to prevent a short-circuit in the resultant overlapping portion even if the display link wire 137 and the lengthened first touch pad electrode 168 overlap each other.

Subsequently, the protective layer 116 is formed using an inorganic layer over the entire surface thereof.

Subsequently, the planarization layer 118 is formed using an organic layer such as photo-acryl, so as to cover the first touch pad electrode 168, the first display pad electrode 182, the switching thin-film transistor, and the driving thin-film transistor T2 or 130, in order to planarize the structure thereunder and to form the light-emitting element on the top flat surface thereof.

Subsequently, the planarization layer 118 and the protective layer 116 are selectively removed to form the pixel connection hole 148, which exposes the drain electrode 138.

In this process, the first touch pad connection hole 178a and the first display pad connection hole 190 are formed in the pad unit.

Figure 9B:
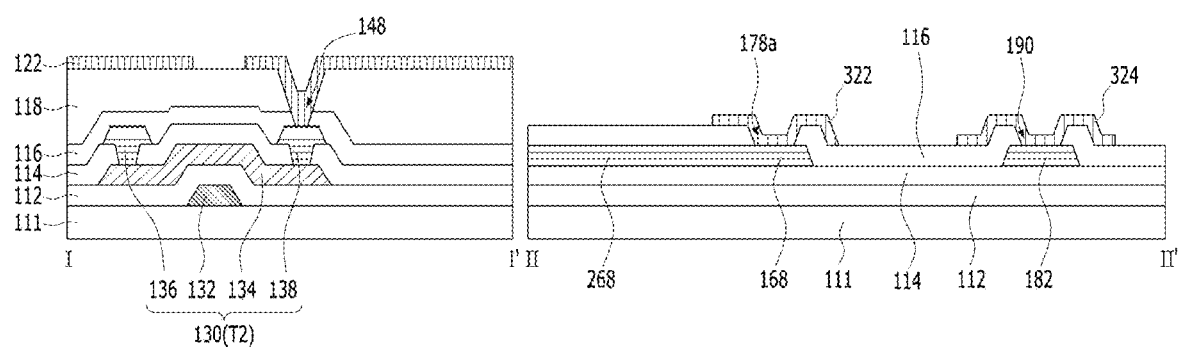

Subsequently, as illustrated in FIG. 9B, by depositing a first conductive layer, which is a reflective electrode, a transparent electrode, or a lamination thereof, on the planarization layer 118 and the pad unit from which the planarization layer 118 has been removed, and selectively removing the same, the anode electrode 122 is formed for each subpixel SP, the first connection pad electrode 322 is formed so as to be connected to the first touch pad electrode 168 through the first touch pad connection hole 178a, and the second connection pad electrode 324 is formed so as to be connected to the first display pad electrode 182 through the first display pad connection hole 190. In some cases, the formation of the first and second connection pad electrodes 322 and 324 may be omitted.

Figure 9C:
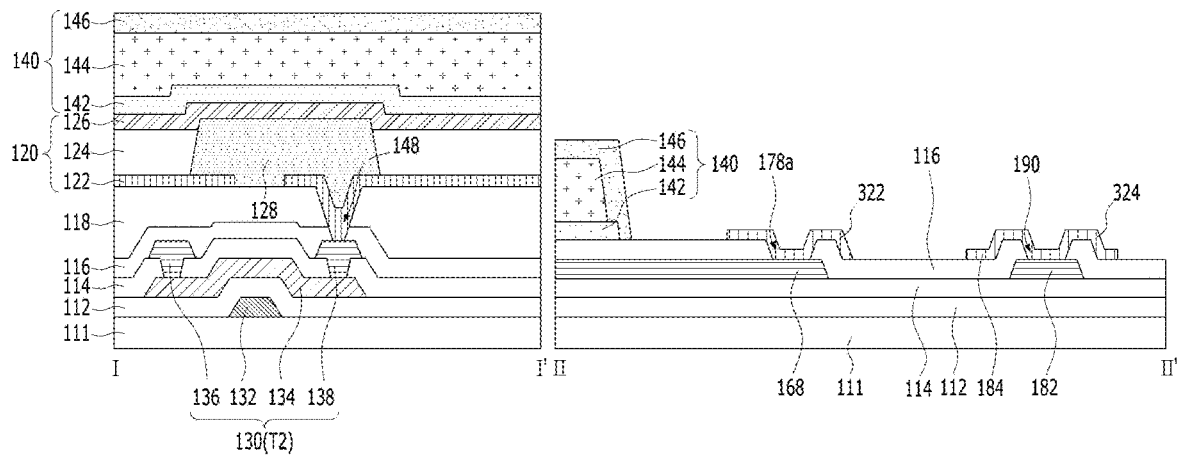

Subsequently, as illustrated in FIG. 9C, the bank 128, a portion of which overlaps the anode electrode 122 to define an emission area, is formed, and the light-emitting stack 124 including the emission layer and the cathode electrode 126 are sequentially formed. Here, the anode electrode 122, the light-emitting stack 124, and the cathode electrode 126 function as the light-emitting element 120.

The encapsulation layer 140 is formed by alternately laminating the inorganic encapsulation layers 142 and 146 and the organic encapsulation layer 144 on the substrate 111, on which the cathode electrode 126 has been formed. Here, in order to sufficiently cover the light-emitting element 120 thereunder, the encapsulation layer 140 covers the entire active area AA and is lengthened to the non-active area excluding the pad unit so as to cover the display link wire 137, which is formed in advance (shown in FIG. 4B).

Figure 9D:
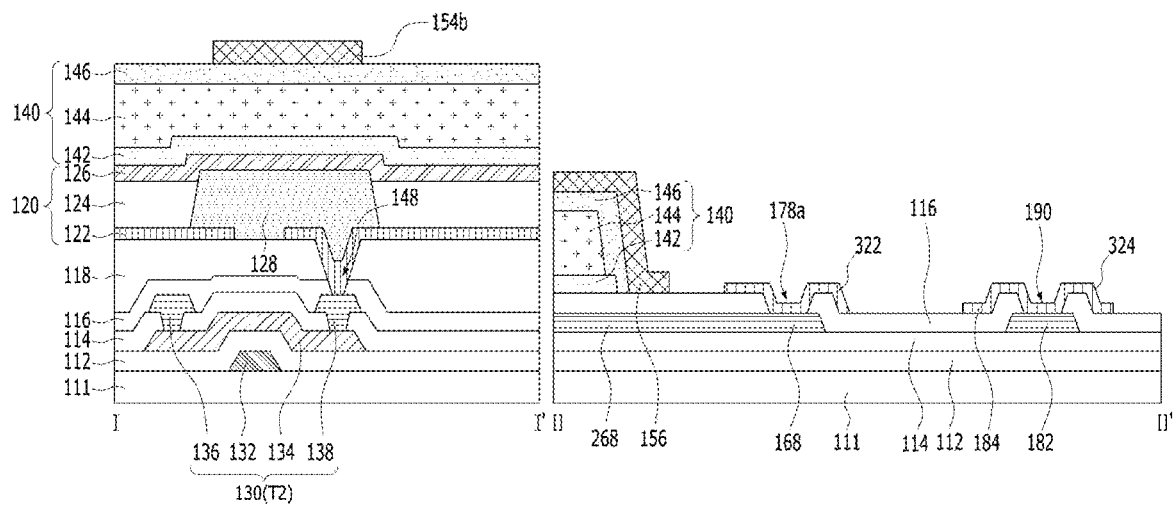

Subsequently, as illustrated in FIG. 9D, the second bridge 154b is formed in a single layer or in multiple layers to have an island shape by using a metal having strong corrosion resistance and acid resistance, such as Al, Ti, Cu, and Mo, on the uppermost inorganic encapsulation layer 146 of the encapsulation layer 140, and simultaneously, the touch link wire 156 is formed in the non-active area. At this time, the touch link wire 156, which extends along the sidewall of the encapsulation layer 140 and enters the non-active area, is spaced apart from the first connection pad electrode 322, which constitutes the touch pad TP.

Figure 9E:
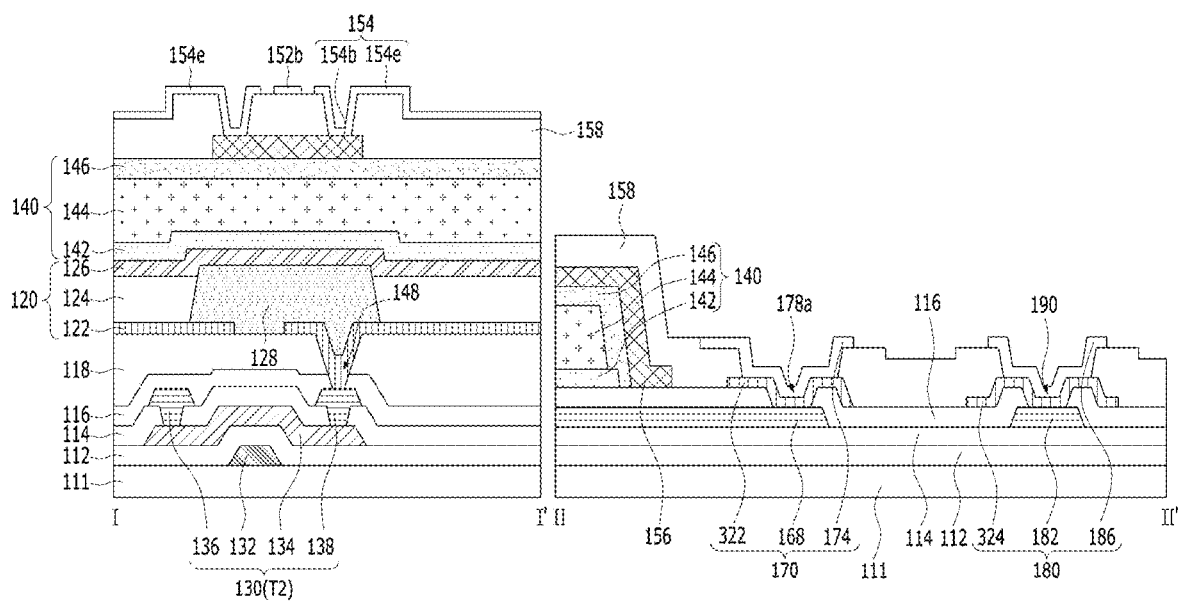

Subsequently, as illustrated in FIG. 9E, the touch insulation layer 158 is deposited to have a thickness ranging from 500 Å to 5 µm through a deposition or coating process over the entire surface including the second bridge 154b, the touch link wire 156, and the first and second connection pad electrodes 322 and 324. Then, to expose opposite ends of the second bridge 154b and the top portion of the first and second connection pad electrodes 322 and 324, the touch connection holes 150, and connection holes at the same positions as the first touch pad connection hole 178a and the first display pad connection hole 190 are formed in the touch insulation layer 158.

Subsequently, by depositing a second conductive layer on the touch insulation layer 158 including the touch connection hole 150, the first touch pad connection hole 178a, and the first display pad connection hole 190, and then selectively removing the same, in the active area, each second touch pattern 154e, which is connected to the second bridge 154b through the touch connection hole 150, each first touch pattern (see 152e of FIG. 4B), which is spaced apart from the second touch pattern 154e and is arranged in a direction intersecting the second touch pattern 154e, and the first bridge 152b, which integrally interconnects neighboring first touch patterns 152e, are formed. In addition, the second touch pad electrode 174, which is connected to the first connection pad electrode 322 thereunder through the first touch pad connection hole 178a, and the second display pad electrode 186, which is connected to the second connection pad electrode 324 thereunder through the first display pad connection hole 190, are formed.

Figure 9F:
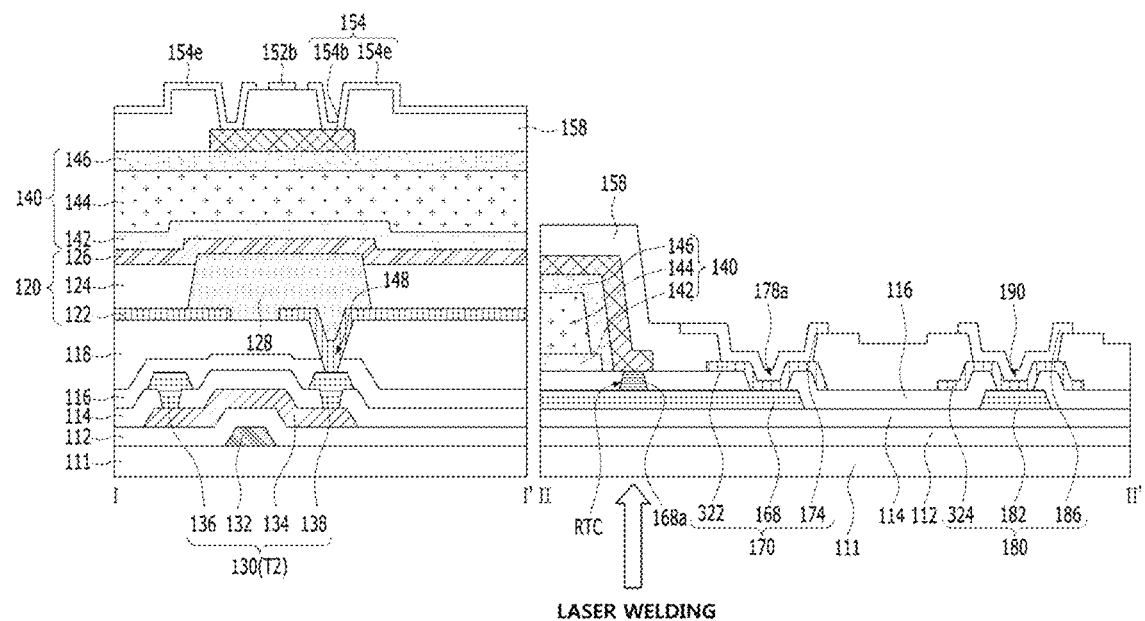

Subsequently, as illustrated in FIG. 9F, below the substrate 111, an overlapping portion of the lengthened first touch pad electrode 168 and the touch link wire 156 is subjected to laser welding so that a portion of the first touch pad electrode 168 melts and is connected to the touch link wire 156 thereabove to form the electric connector RTC. During laser welding, the thin protective layer 116 between the touch link wire 156 and the first touch pad electrode 168 burns, and the burned region is filled with the touch pad electrode pattern 168a as a molten portion, so that the first touch pad electrode 168, the first touch pad electrode pattern 168a, and the touch link wire 156, which are sequentially formed from the bottom, are electrically connected to each other.

Here, the protective layer 116 is a thin protective layer and is selectively removable by adjusting laser energy without having an effect on the other layers during laser welding.

Figure 9G:
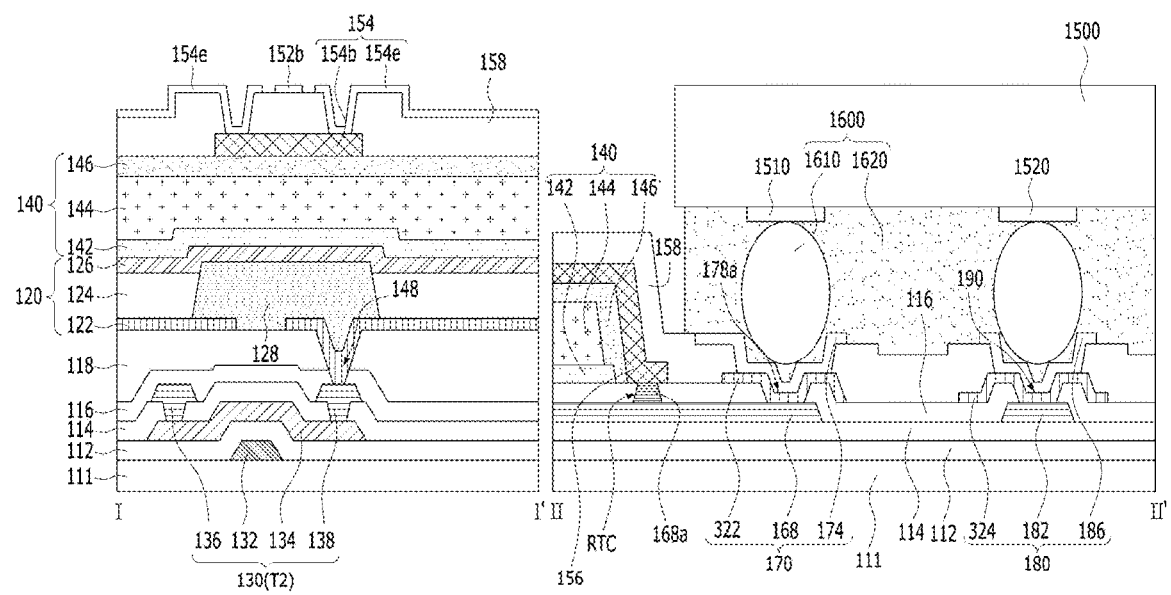

Subsequently, as illustrated in FIG. 9G, in order to apply an electrical signal to the scan line SL, the data line DL, and the first and second touch electrodes 152 and 154, the printed circuit board 1500, which includes a drive IC and a touch controller therein, is provided. At this time, the printed circuit board 1500 includes the bump electrodes 1510 and 1520 at positions corresponding to the touch pad TP or 170 and the display pad DP or 180. The anisotropic conductive film 1600 is interposed between the printed circuit board 1500 and the pad unit PT and DP of the substrate 111 to achieve electrical connection when pressure is applied to the back side of the flexible printed circuit board 1500.

Here, in the anisotropic conductive film 1600, the conductive balls 1610 are contained in the adhesive layer 1620. When pressure is applied, the conductive balls 1610 are broken so as to achieve electrical connection between the bump electrode 1510 or 1520 and the touch pad 170 or the display pad 180 located thereabove and thereunder.

Meanwhile, the organic light-emitting display device having the touchscreen according to the present disclosure may further include a color filter above or below the first and second touch electrodes 152 and 154. This will be described below in a fourth aspect.

Figure 10:
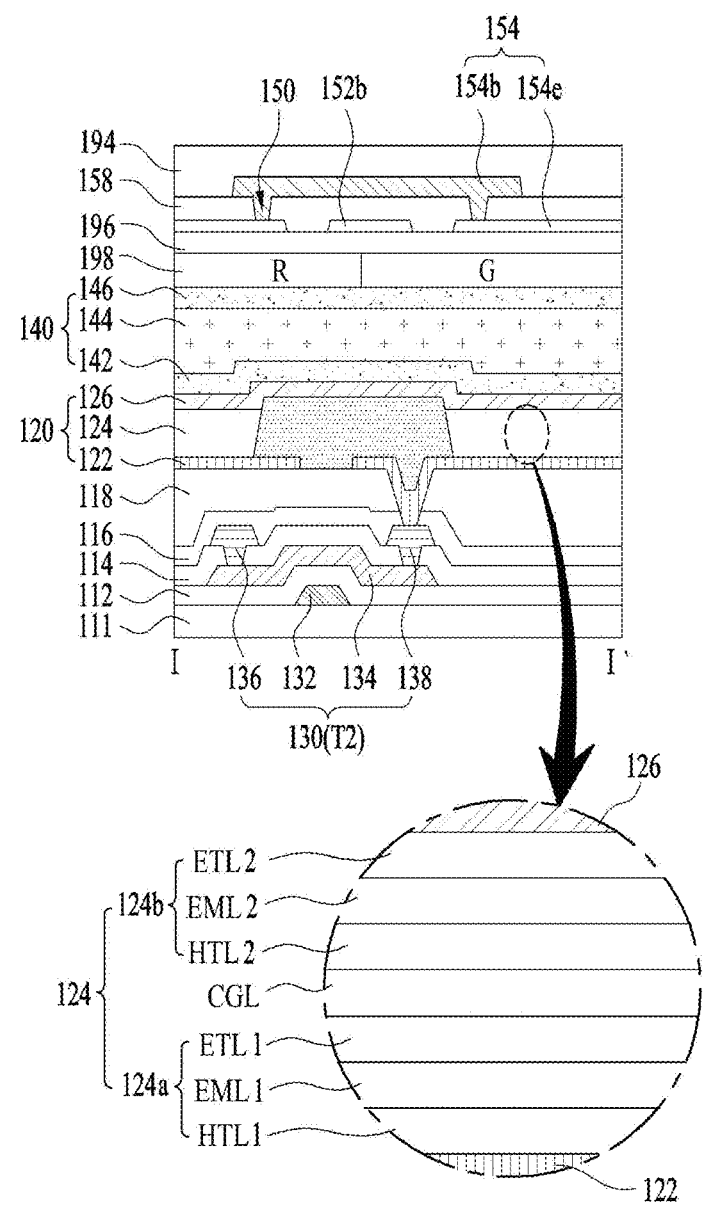
FIG. 10 is a cross-sectional view illustrating the organic light-emitting display device having the touchscreen according to a fourth aspect of the present disclosure.

FIG. 10 is a cross-sectional view illustrating an organic light-emitting display device having a touchscreen according to a fourth aspect of the present disclosure.

That is, the organic light-emitting display device having the touchscreen according to the fourth aspect of the present disclosure, as illustrated in FIG. 10, may include a touch buffer layer 196 or a color filter layer 198 between the encapsulation layer 140 and a touch electrode array including the first and second touch electrodes 152 and 154. Here, the touch buffer layer 196 and the color filter layer 198 may be selectively provided, or may be provided together. In addition, when all of the two layers are provided, the touch buffer layer 196 may be provided below the color filter layer 198, or the touch buffer layer 196 may be provided above the color filter layer 198, as illustrated.

The touch buffer layer 196 maintains a minimum vertical distance of 5 µm between the first and second touch electrodes 152 and 154 and the cathode electrode 126. Thereby, it is possible to minimize the capacity value of a parasitic capacitor formed between each of the first and second touch electrodes 152 and 154 and the cathode electrode 126, which may prevent mutual interaction due to coupling between each of the touch-sensing line 154 and the touch-driving line 152 and the light-emitting element 120.

Meanwhile, the organic light-emitting display device of the present disclosure has been described as one light-emitting stack 124 being disposed between the anode electrode 122 and the cathode electrode 126 by way of example, however, two or more light-emitting stacks may be disposed. For example, as illustrated in FIG. 9, the first and second light-emitting stacks 124a and 124b may be disposed between the anode electrode 122 and the cathode electrode 126. A charge generation layer CGL is disposed between the first and second light-emitting stacks 124a and 124b. The first light-emitting stack 124a includes a hole transport layer HTL1, an organic emission layer EML1, and an electron transport layer ETL1, which are sequentially formed on the anode electrode 122, and the second light-emitting stack 124b includes a hole transport layer HTL2, an organic emission layer EML2, and an electron transport layer ETL2, which are sequentially formed on the anode electrode 122. Here, one of the emission layer EML1 of the first light-emitting stack 124a and the emission layer EML2 of the second light-emitting stack 124b generates blue light, and the other one of the emission layer EML1 of the first light-emitting stack 124a and the emission layer EML2 of the second light-emitting stack 124b generates yellow green light, whereby white light is generated via the first and second light-emitting stacks 124a and 124b.

Then, the color filter layer 198, which is disposed on the encapsulation layer 140 above the light-emitting element 120, may perform color display by transmitting white light from the lower side thereof through each wavelength band.

Here, the color filter layer 198 may be located above any one of the cathode electrode 126, the encapsulation layer 140, and the first and second touch electrodes 152 and 154 as long as it is disposed above the cathode electrode 126. In some cases, the color filter layer 198 may also be used as the touch insulation layer 158 below the first and second touch electrodes 152 and 154.

As is apparent from the above description, an organic light-emitting display device having a touchscreen and a method of manufacturing the same according to the present disclosure have the following effects.

First, since a touch pad and a display pad are provided on the same side of a substrate, both the touch pad and the display pad may be connected via a single flexible printed circuit board.

Second, since the touch pad and the display pad, which constitute a pad unit, have the same lamination structure, when the flexible printed circuit board is aligned with the pad unit, connection therebetween without a difference in height is possible, which may increase bonding reliability. In addition, in the vertical cross sections of the touch pad and the display pad, areas thereof corresponding to conductive balls have the same surface height, whereby it is possible to improve the form factor of circuit components disposed on the substrate.

Third, since the pad unit is provided on only one side of the substrate, it is possible to increase an effective display area, compared to a conventional structure in which a touch pad and a display pad are provided on different sides.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure.

What is claimed is:

1. An organic light-emitting display device comprising:
   a substrate comprising an active area and a non-active area;
   a plurality of thin-film transistors disposed in the active area;
   a plurality of light-emitting elements connected to the plurality of thin-film transistors in the active area;
   an encapsulation layer disposed on the plurality of thin-film transistors and the plurality of light-emitting elements;
   a touch electrode array disposed on a top of the encapsulation layer;
   a touch buffer layer between the touch electrode array and the top of encapsulation layer;
   at least one display pad and at least one touch pad arranged in the non-active area on a same side of the substrate and spaced apart from each other; and
   a flexible printed circuit board connected to the side of the substrate.

2. The device according to claim 1, further comprising a touch link wire disposed along a side surface of the encapsulation unit.

3. The device according to claim 1,
   wherein the at least one display pad includes a plurality of display pad and the at least one touch pad includes a plurality of touch pads, and
   wherein the device further comprises:
   a plurality of touch link wires provided in the non-active area above the encapsulation layer on the substrate and connecting the plurality of touch pads to the touch electrode array; and
   a plurality of display link wires provided in the non-active area below the encapsulation layer on the substrate and connecting the plurality of display pads to the thin-film transistors.

4. The device according to claim 3,
   wherein the plurality of touch link wires and plurality of the display link wires have an overlapping portion by interposing the encapsulation layer therebetween.

5. The device according to claim 1,
   wherein the touch electrode array includes a plurality of first touch electrodes and a plurality of second touch electrodes, and
   the plurality of first touch electrodes and the plurality of second touch electrodes arranged on a top of the encapsulation layer to intersect each other in the active area.

6. The device according to claim 5, wherein each of the plurality of first touch electrodes comprises a first touch pattern and a first bridge,
   wherein each of the plurality of second touch electrodes comprises a second touch pattern and a second bridge,
   wherein the first touch pattern and the second touch pattern are disposed in the same layer,
   wherein the first bridge is integrated with the first touch pattern, and
   wherein the second bridge is located in a layer different from the first touch pattern and the second touch pattern, interposes a touch insulation layer therebetween at an intersection of the first touch electrode and the second touch electrode, and is connected to the second touch pattern through a touch connection hole in the touch insulation layer.

7. The device according to claim 3,
wherein each of the plurality of touch pads comprises touch pad electrodes in multiple layers, and
wherein each of the plurality of touch link wires is located in the same layer as the second bridge, and is integrated with at least one layer of the multiple layers in the touch pad electrodes.

8. The device according to claim 3,
wherein each of the plurality of touch pads comprises touch pad electrodes in multiple layers,
wherein each of the plurality of touch link wires is located in the same layer as the first bridge, and
wherein at least one touch pad electrode is extended to connect to each of the plurality of touch link wires.

9. The device according to claim 3,
wherein each of the plurality of touch pads comprises touch pad electrodes in multiple layers,
wherein the organic light-emitting display device further comprises one or more insulation layers between the plurality of the touch link wires and at least one touch pad electrode of the plurality of touch pads, and
wherein each of the plurality of touch link wires is electrically connected to the at least one touch pad electrode through a connection hole in the one or more insulation layers.

10. The device according to claim 9, wherein the one or more insulation layers between the plurality of touch link wires and the at least one touch pad electrode of the plurality of touch pads are inorganic layers.

11. The device according to claim 9,
wherein each of the plurality of display pads comprises a first display pad electrode in the same layer as the plurality of thin-film transistors and a second display pad electrode in a layer different from the first display pad electrode, and
wherein each of the plurality of touch pads comprises a first touch pad electrode in the same layer as the first display pad electrode and a second touch pad electrode in the same layer as the second display pad electrode.

12. The device according to claim 7, wherein the second display pad electrode and the second touch pad electrode are located in the same layer as the first touch pattern and the second touch pattern.

13. The device according to claim 9, wherein the one or more insulation layers having the connection hole are located between the first touch pad electrode and each of the plurality of touch link wires, and the connection hole is located above the first touch pad electrode and below each of the plurality of touch link wires.

14. The device according to claim 9, further comprising a connection pad electrode located in the same layer as one layer of the plurality of light-emitting elements between a first touch pad electrode and a second touch pad electrode of each of the plurality of touch pads.

15. The device according to claim 1, wherein each light-emitting element comprises:
an anode electrode connected to a corresponding one of the plurality of thin-film transistors;
a cathode electrode disposed to face the anode electrode; and
at least one light-emitting stack disposed between the anode electrode and the cathode electrode.

16. The device according to claim 1, wherein the flexible printed circuit board includes a drive IC and a touch controller.

17. The device according to claim 1, wherein the flexible printed circuit board includes a bump electrode corresponding to the touch pad or the display pad.

18. The device according to claim 17, wherein the bump electrode is electrically connected to the touch pad or the display pad located thereabove and thereunder.

19. The device according to claim 15, wherein each light-emitting element includes two or more light-emitting stacks between the anode electrode and the cathode electrode.

20. The device according to claim 15, wherein each light-emitting element includes first and second light-emitting stacks, and
wherein white light is generated via the first and second light-emitting stacks.

* * * * *